US012300335B2

(12) United States Patent
Kim et al.

(10) Patent No.: US 12,300,335 B2
(45) Date of Patent: May 13, 2025

(54) STORAGE CONTROLLER USING HISTORY DATA, METHOD OF OPERATING THE SAME, AND METHOD OF OPERATING STORAGE DEVICE INCLUDING THE SAME

(71) Applicant: SAMSUNG ELECTRONICS CO., LTD., Suwon-si (KR)

(72) Inventors: Hyuna Kim, Suwon-si (KR); Woohyun Kang, Hwaseong-si (KR); Youngdeok Seo, Seoul (KR); Hyunkyo Oh, Yongin-si (KR); Donghoo Lim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 344 days.

(21) Appl. No.: 17/893,476

(22) Filed: Aug. 23, 2022

(65) Prior Publication Data

US 2023/0187002 A1    Jun. 15, 2023

(30) Foreign Application Priority Data

Dec. 15, 2021    (KR) .......................... 10-2021-0179494

(51) Int. Cl.
*G11C 16/34*    (2006.01)
*G11C 16/26*    (2006.01)

(52) U.S. Cl.
CPC .......... *G11C 16/3495* (2013.01); *G11C 16/26* (2013.01); *G11C 16/3404* (2013.01)

(58) Field of Classification Search
CPC ........................... G11C 16/3495; G11C 16/34
USPC ...................................................... 365/185.24
See application file for complete search history.

(56) References Cited

U.S. PATENT DOCUMENTS

| | | | |
|---|---|---|---|
| 7,475,297 B1* | 1/2009 | Manaker, Jr. ......... | G06F 30/396 716/113 |
| 8,060,797 B2 | 11/2011 | Hida et al. | |
| 8,689,082 B2 | 4/2014 | Oh et al. | |
| 9,223,656 B2 | 12/2015 | Kim | |
| 9,632,868 B2 | 4/2017 | Song | |
| 10,310,924 B2 | 6/2019 | Jei et al. | |
| 10,373,693 B2 | 8/2019 | Cha et al. | |
| 2015/0370629 A1* | 12/2015 | Song ................... | G06F 11/1048 714/721 |
| 2018/0342305 A1* | 11/2018 | Cha ..................... | G11C 13/0033 |
| 2020/0409788 A1* | 12/2020 | Kurose ............... | G11C 16/0483 |
| 2021/0166774 A1 | 6/2021 | Cha et al. | |
| 2022/0326884 A1* | 10/2022 | Kang ..................... | G06F 13/28 |

* cited by examiner

Primary Examiner — Muna A Techane
(74) Attorney, Agent, or Firm — Wolf, Greenfield & Sacks, P.C.

(57) ABSTRACT

Disclosed is a storage controller which includes a history table and communicates with a non-volatile memory device. A method of operating the storage controller includes determining whether history data of a target memory block are registered at the history table, providing a history read request for the target memory block based on the history data when it is determined that the history data are registered, receiving first raw data corresponding to the history read request from the non-volatile memory device, generating skew information of the target memory block based on the first raw data and the history data, and determining whether to perform a read reclaim operation of the target memory block, based on the skew information.

20 Claims, 18 Drawing Sheets

FIG. 4
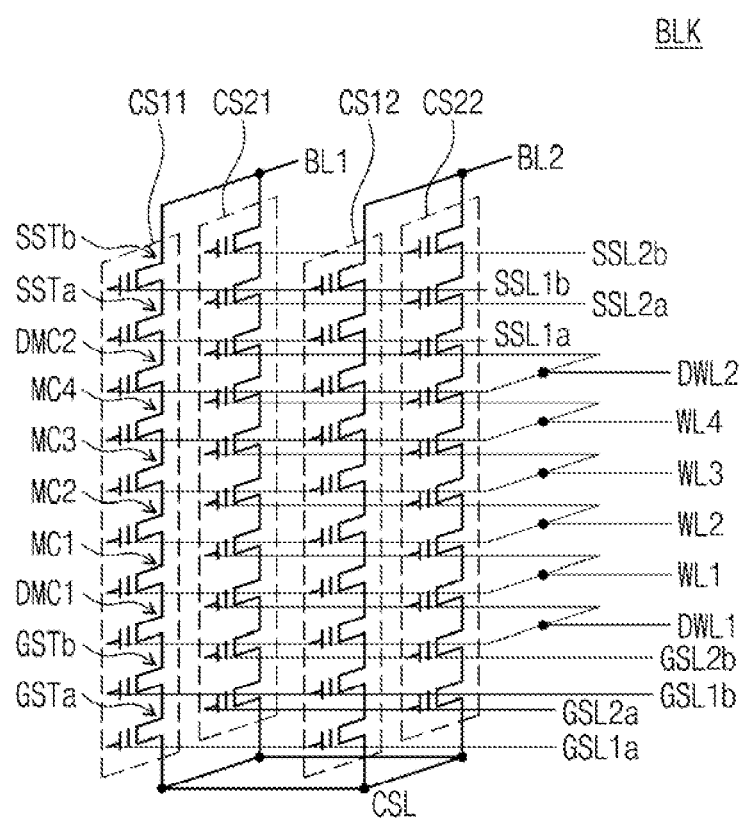
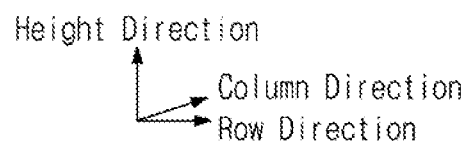

FIG. 8

| Block Index | Page Type | History Data (HD) | | | |
|---|---|---|---|---|---|
| | | Count Information (CI) | Error Count Information (ECI) | Optimized Read Voltage Information (ORVI) | |
| | | | | Read Voltage Type | Information |
| BLK1 | Type1(LSB) | CI1-LSB | ECI1-LSB | VR1(LSB) | ORVI1-VR1 |
| | | | | VR5(LSB) | ORVI1-VR5 |
| | Type2(CSB) | CI1-CSB | ECI1-CSB | VR2(CSB) | ORVI1-VR2 |
| | | | | VR4(CSB) | ORVI1-VR4 |
| | | | | VR6(CSB) | ORVI1-VR6 |
| | Type3(MSB) | CI1-MSB | ECI1-MSB | VR3(MSB) | ORVI1-VR3 |
| | | | | VR7(MSB) | ORVI1-VR7 |
| BLK2 | Type1(LSB) | CI2-LSB | ECI2-LSB | VR1(LSB) | ORVI2-VR1 |
| | | | | VR5(LSB) | ORVI2-VR5 |
| | Type2(CSB) | CI2-CSB | ECI2-CSB | VR2(CSB) | ORVI2-VR2 |
| | | | | VR4(CSB) | ORVI2-VR4 |
| | | | | VR6(CSB) | ORVI2-VR6 |
| | Type3(MSB) | CI2-MSB | ECI2-MSB | VR3(MSB) | ORVI2-VR3 |
| | | | | VR7(MSB) | ORVI2-VR7 |
| ... | ... | ... | ... | ... | ... |
| BLKN | Type1(LSB) | CIN-LSB | ECIN-LSB | VR1(LSB) | ORVIN-VR1 |
| | | | | VR5(LSB) | ORVIN-VR5 |
| | Type2(CSB) | CIN-CSB | ECIN-CSB | VR2(CSB) | ORVIN-VR2 |
| | | | | VR4(CSB) | ORVIN-VR4 |
| | | | | VR6(CSB) | ORVIN-VR6 |
| | Type3(MSB) | CIN-MSB | ECIN-MSB | VR3(MSB) | ORVIN-VR3 |
| | | | | VR7(MSB) | ORVIN-VR7 |

History Table (112)

FIG. 9
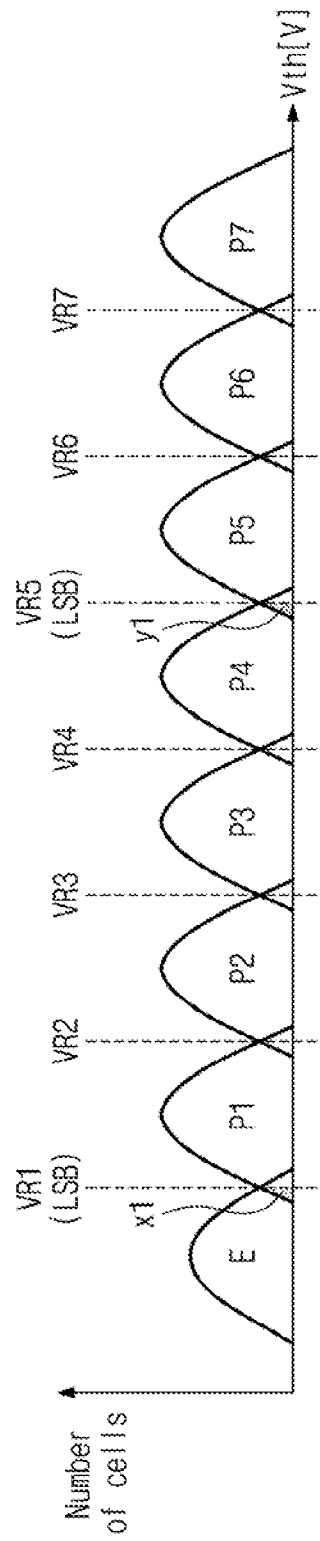
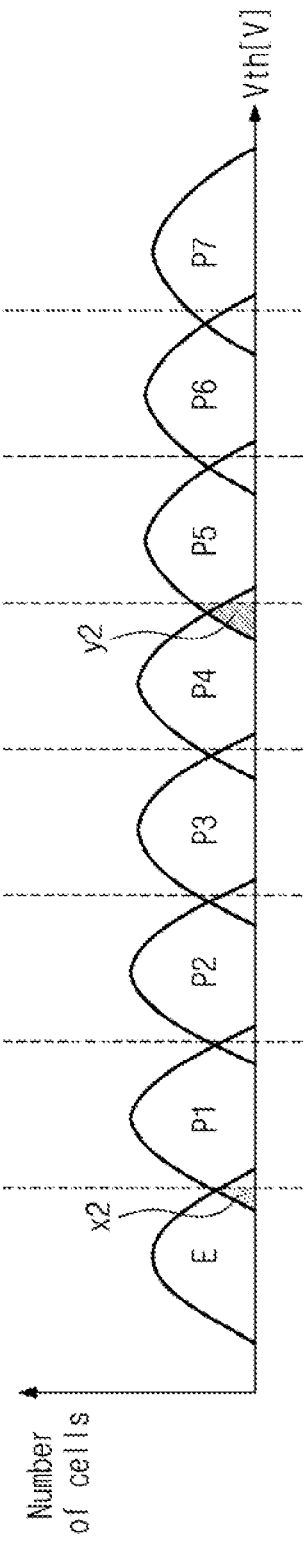

STORAGE CONTROLLER USING HISTORY DATA, METHOD OF OPERATING THE SAME, AND METHOD OF OPERATING STORAGE DEVICE INCLUDING THE SAME

CROSS-REFERENCE TO RELATED APPLICATION

This application claims priority under 35 U.S.C. § 119 to Korean Patent Application No. 10-2021-0179494 filed on Dec. 15, 2021, in the Korean Intellectual Property Office, the disclosures of which are incorporated by reference herein in their entireties.

BACKGROUND

1. Field

Embodiments relate to a storage device, and more particularly, relate to a storage controller using history data, a method of operating the same, and a method of operating a storage device including the same.

2. Description of the Related Art

A memory device stores data in response to a write request and outputs data stored therein in response to a read request. For example, the memory device is classified as a volatile memory device, which loses data stored therein when a power supply is turned off, such as a dynamic random access memory (DRAM) device or a static RAM (SRAM) device, or a non-volatile memory device, which retains data stored therein even when a power supply is turned off, such as a flash memory device, a phase-change RAM (PRAM), a magnetic RAM (MRAM), or a resistive RAM (RRAM).

SUMMARY

According to an embodiment, a storage controller includes a history table and communicates with a non-volatile memory device. A method of operating the storage controller includes determining whether history data of a target memory block are registered at the history table, providing a history read request for the target memory block based on the history data when it is determined that the history data are registered, receiving first raw data corresponding to the history read request from the non-volatile memory device, generating skew information of the target memory block based on the first raw data and the history data, and determining whether to perform a read reclaim operation of the target memory block, based on the skew information.

According to an embodiment, a storage device includes a non-volatile memory device and a storage controller. A method of operating the storage device includes determining, by the storage controller, whether history data of a target memory block are registered at a history table of the storage controller, providing, by the storage controller, a history read request for the target memory block based on the history data when it is determined that the history data are registered, providing, by the non-volatile memory device, raw data corresponding to the history read request, generating, by the storage controller, skew information of the target memory block based on the raw data and the history data, and determining, by the storage controller, whether to perform a read reclaim operation of the target memory block, based on the skew information.

According to an embodiment, a storage controller includes a history table that manages history data of a target memory block of a non-volatile memory device, a read management module that manages a history read operation with reference to the history table, a command generator that provides the non-volatile memory device with a first command indicating a history read request for the target memory block under control of the read management module, a skew information management module that receives first raw data corresponding to the first command from the non-volatile memory device, receives the history data from the history table, and generates skew information of the target memory block based on the first raw data and the history data, and a read reclaim module that manages a read reclaim operation of the target memory block based on the skew information.

BRIEF DESCRIPTION OF THE FIGURES

Features will become apparent to those of skill in the art by describing in detail example embodiments with reference to the attached drawings in which:

FIG. 4 is a diagram describing a memory block of a memory cell array of FIG. 3, according to some example embodiments.

FIG. 8 is a diagram describing a history table according to some example embodiments.

FIG. 9 is a diagram describing a change of a threshold voltage distribution according to some example embodiments.

DETAILED DESCRIPTION

Figure 1:
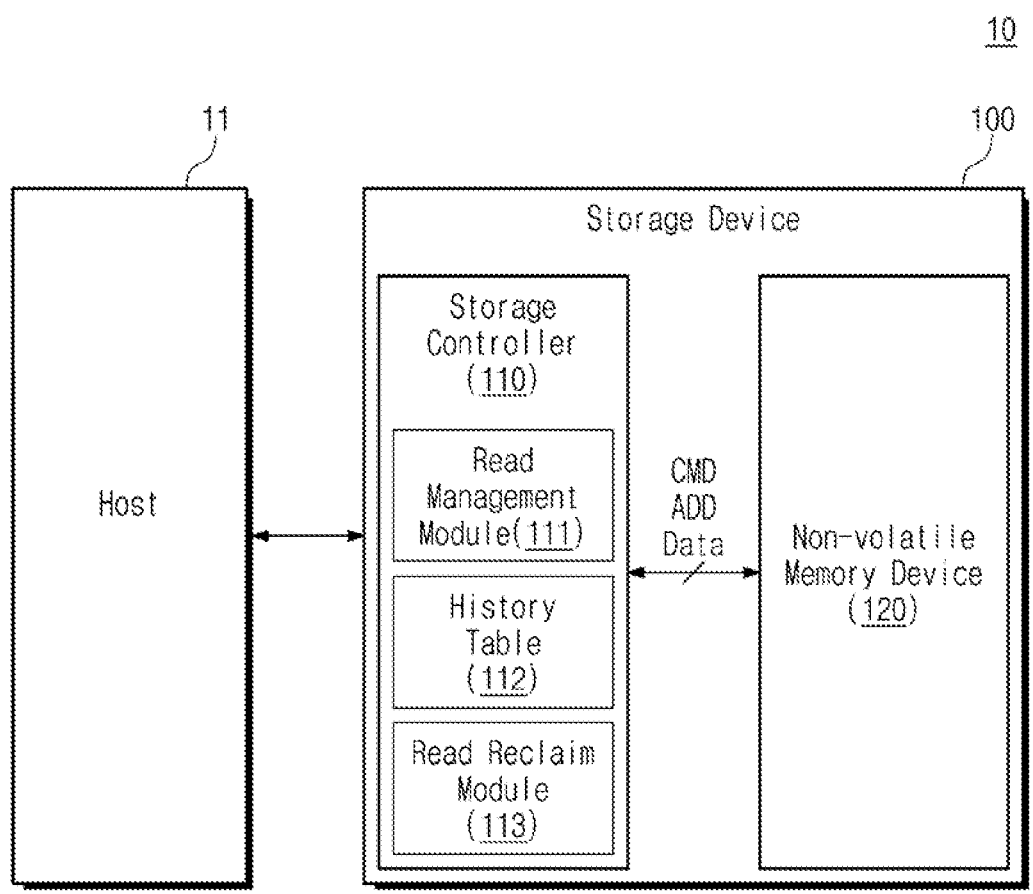
FIG. 1 is a block diagram of a storage system according to an example embodiment.

FIG. 1 is a block diagram of a storage system according to an example embodiment.

Referring to FIG. 1, a storage system 10 may include a host 11 and a storage device 100. In some example embodiments, the storage system 10 may be a computing system, which is configured to process a variety of information, such as a personal computer (PC), a notebook, a laptop, a server, a workstation, a tablet PC, a smartphone, a digital camera, and a black box.

The host 11 may control an overall operation of the storage system 10. For example, the host 11 may store data in the storage device 100, or may read data stored in the storage device 100.

The storage device 100 may include a storage controller 110 and a non-volatile memory device 120. The non-volatile memory device 120 may store data. The storage controller 110 may store, e.g., write, data in the non-volatile memory device 120, or may read data stored in the non-volatile memory device 120. The non-volatile memory device 120 may operate under control of the storage controller 110. For example, based on a command CMD indicating an operation and an address ADD indicating a location of data, the storage controller 110 may store the data in the non-volatile memory device 120 or may read the data stored in the non-volatile memory device 120.

In some example embodiments, the non-volatile memory device 120 may be a NAND flash memory device, or one of various storage devices, which retain data stored therein even though a power is turned off, such as a phase-change random access memory (PRAM), a magnetic random access memory (MRAM), a resistive random access memory (RRAM), and a ferroelectric random access memory (FRAM).

The storage controller 110 may include a read management module 111, a history table 112, and a read reclaim module 113.

The read management module 111 may manage an operation of reading data stored in the non-volatile memory device 120. For example, the read management module 111 may automatically start a read operation depending on an algorithm of firmware, or may start the read operation based on a read request from the host 11. The read management module 111 may determine whether history data of a target memory block corresponding to the initiated read operation are registered, with reference to the history table 112. The target memory block may be a memory block, on which the read operation is to be performed, from among a plurality of memory blocks included in the non-volatile memory device 120.

When it is determined that the history data of the target memory block are registered, the read management module 111 may perform a history read operation on the target memory block. The history read operation may be an operation of referring to the history data of the history table 112 to read data of the non-volatile memory device 120 based on an optimized read voltage. The optimized read voltage may be a read voltage that is determined in consideration of a distribution characteristic (e.g., a change of a threshold voltage distribution due to various factors such as retention, read disturb, hot-carrier injection (HCI), etc.) of the target memory block when history data are registered.

When it is determined that the history data of the target memory block are not registered, the read management module 111 may perform a normal read operation on the target memory block. The normal read operation may be an operation of reading data of the non-volatile memory device 120 based on a default read voltage. The default read voltage may be a read voltage that is optimized under the condition of an initial state where data are programmed without consideration of the distribution characteristic of the target memory block.

The history table 112 may manage history data. For example, the non-volatile memory device 120 may include the plurality of memory blocks, and the history table 112 may manage history data for each of the plurality of memory blocks. The history data may be generated based on raw data of the read operation received from the non-volatile memory device 120 without a separate additional read operation.

The history data may include at least one of count information, error count information, or optimized read voltage information. The count information may indicate the number of memory cells having a first value (e.g., "1") from among a plurality of memory cells, each of which has a first value or a second value (e.g., "0"). The error count information may indicate the number of memory cells, each of which is determined as the second value being stored therein even though it is programmed to have the first value, or is determined as the first value being stored therein even though it is programmed to have the second value. The optimized read voltage information may indicate a level of a read voltage that is optimized in consideration of the distribution characteristic of the target memory block. The history table 112 will be described in further detail with reference to FIGS. 6, 7, and 8.

The read reclaim module 113 may manage a read reclaim operation of the target memory block of the non-volatile memory device 120. The read reclaim operation may be an operation of copying data stored in a degraded target memory block back to another memory block for the purpose of securing the reliability of the non-volatile memory device 120.

In some example embodiments, the read reclaim module 113 may perform an early read reclaim operation based on skew information before an uncorrectable error occurs. For example, the storage controller 110 may include a skew information management module, and the skew information management module may receive raw data according to the history read operation from the non-volatile memory device 120. The skew information management module may generate skew information based on raw data and history data of the history table 112, and may provide the skew information to the read reclaim module 113. The read reclaim module 113 may perform the early read reclaim operation based on the skew information.

The early read reclaim operation may be a read reclaim operation that is performed preemptively, e.g., before the performance of a target memory block is degraded. In general, when an uncorrectable error occurs in the target memory block, the storage controller 110 may execute a defense code to perform a normal read reclaim operation. In the case where the normal read reclaim operation is performed after performance is sufficiently degraded, performance drop-off (e.g., a sharp decrease of a data input/output (I/O) speed) of the target memory block may occur. To avoid this, the read reclaim module 113 may detect degradation of the target memory block based on the skew information, and may request the early read reclaim operation before the performance drop-off of the target memory block occurs. The early read reclaim operation will be described in further detail with reference to FIG. 12.

As described above, the present example embodiment may provide the storage device 100, which generates the skew information based on raw data and history data, and determines whether to perform the read reclaim operation based on the skew information. Also, the read reclaim operation may be performed based on skew information that is obtained without an additional read operation. Thus, the present example embodiment may provide the storage device 100 that avoids a sharp decrease in the input/output speed, improves the reliability of data stored therein, and improves a speed at which data are processed.

Figure 2:
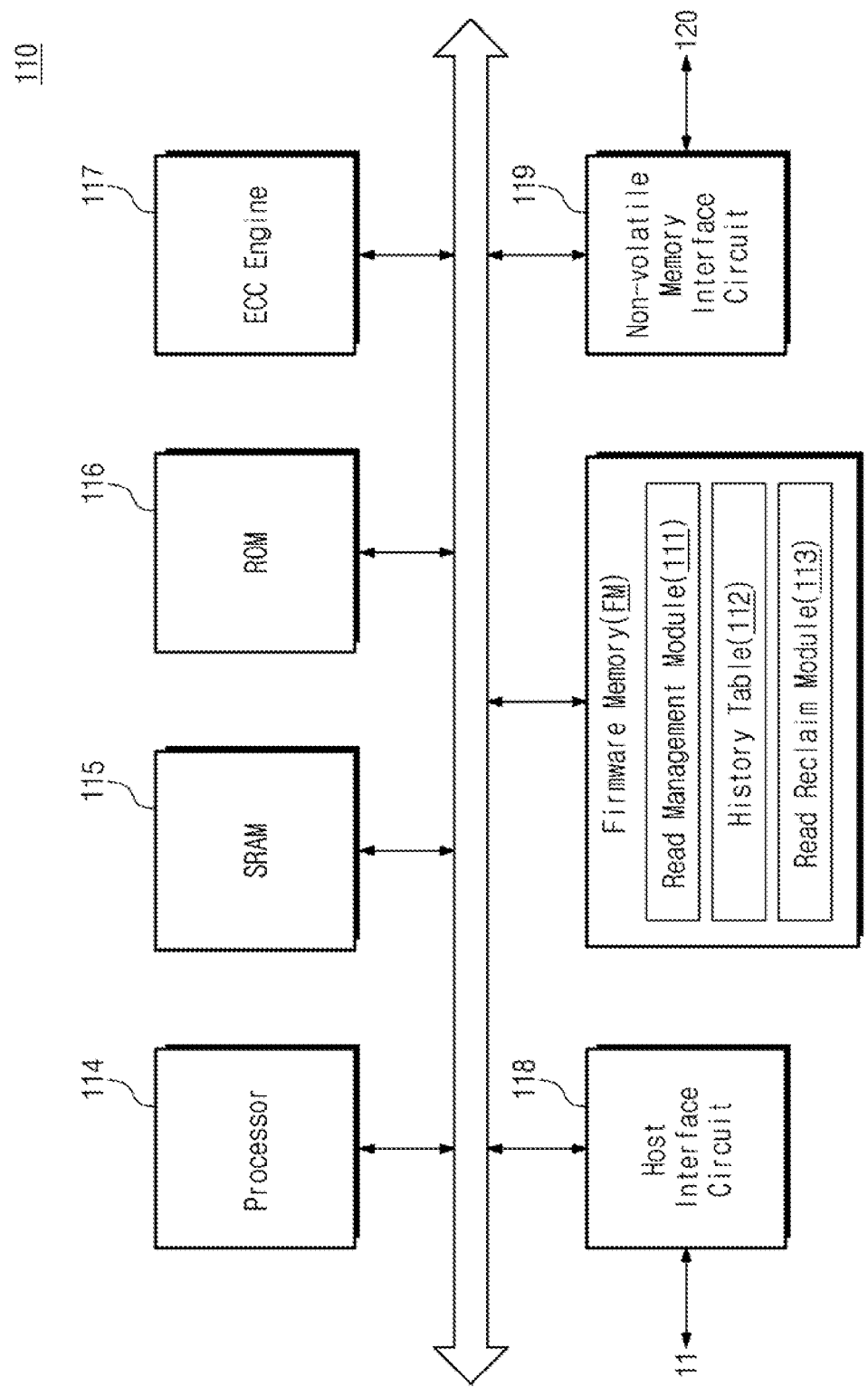
FIG. 2 is a block diagram illustrating a storage controller of FIG. 1 in detail, according to some example embodiments.

FIG. 2 is a block diagram illustrating a storage controller of FIG. 1 in detail, according to some example embodiments.

Referring to FIGS. 1 and 2, the storage controller 110 may communicate with the host 11 and the non-volatile memory device 120. The storage controller 110 may include the read management module 111, the history table 112, the read reclaim module 113, a processor 114, a static random access memory (SRAM) 115, a read only memory (ROM) 116, an error correcting code (ECC) engine 117, a host interface circuit 118, and a non-volatile memory interface circuit 119. The read management module 111, the history table 112, and the read reclaim module 113 are similar to the read management module 111, the history table 112, and the read reclaim module 113 of FIG. 1, and thus, additional description will be omitted to avoid redundancy.

In some example embodiments, the storage controller 110 may include a firmware memory FM. The firmware memory FM may store a variety of information, which is used for the storage controller 110 to operate, in the form of instructions. For example, the read management module 111, the history table 112, and the read reclaim module 113 may be implemented by software, and the instructions stored in the firmware memory FM may execute or implement the read management module 111, the history table 112, and the read reclaim module 113. However, the read management module 111, the history table 112, and the read reclaim module 113 may be implemented with a separate hardware device(s).

The processor 114 may control an overall operation of the storage controller 110. The SRAM 115 may be used as a buffer memory, a cache memory, or a working memory of the storage controller 110. The ROM 116 may be used as a read only memory storing information used for the operation of the storage controller 110.

The ECC engine 117 may detect and correct an error of data read from the non-volatile memory device 120. For example, the ECC engine 117 may have an error correction capability of a given level. The ECC engine 117 may process data having an error level (e.g., the number of flipped bits) exceeding the error correction capability as an uncorrectable error.

In some example embodiments, the ECC engine 117 may generate error count information based on the error correction. For example, a threshold voltage distribution of memory cells of the non-volatile memory device 120 may change due to various factors. Raw data received from the non-volatile memory device 120 as a result of the read operation may include an error bit value to which the distribution change is applied. The ECC engine 117 may perform error correction on the raw data.

The storage controller 110 may communicate with the host 11 through the host interface circuit 118. In some example embodiments, the host interface circuit 118 may be implemented based on at least one of various interfaces such as a serial ATA (SATA) interface, a peripheral component interconnect express (PCIe) interface, a serial attached SCSI (SAS), a nonvolatile memory express (NVMe) interface, or a universal flash storage (UFS) interface.

The storage controller 110 may communicate with the non-volatile memory device 120 through the non-volatile memory interface circuit 119. In some example embodiments, the non-volatile memory interface circuit 119 may be implemented based on a NAND interface.

Figure 3:
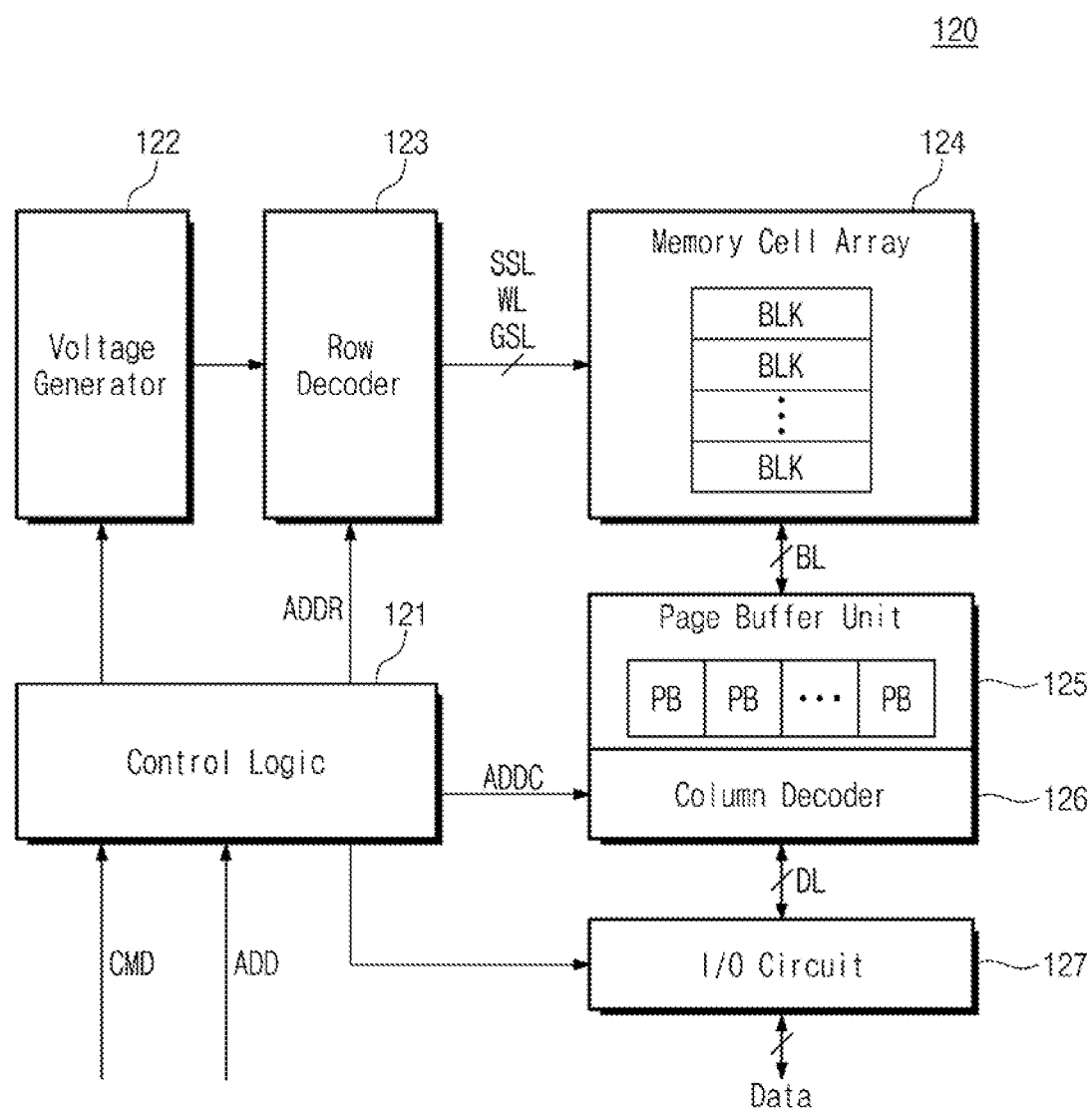
FIG. 3 is a block diagram illustrating a non-volatile memory device of FIG. 1 in detail, according to some example embodiments.

FIG. 3 is a block diagram illustrating a non-volatile memory device of FIG. 1 in detail, according to some example embodiments. FIG. 4 is a diagram describing a memory block of a memory cell array of FIG. 3, according to some example embodiments.

Referring to FIGS. 1, 3, and 4, the non-volatile memory device 120 may communicate with the storage controller 110. For example, the non-volatile memory device 120 may receive the address ADD and the command CMD from the storage controller 110. The non-volatile memory device 120 may exchange data with the storage controller 110.

The non-volatile memory device 120 may include control logic 121, a voltage generator 122, a row decoder 123, a memory cell array 124, a page buffer unit 125, a column decoder 126, and an input/output (I/O) circuit 127.

The control logic 121 may receive the command CMD and the address ADD from the storage controller 110. The command CMD may be a signal indicating an operation to be performed by the non-volatile memory device 120, such as a read operation, a write operation, or an erase operation. The address ADD may include a row address ADDR and a column address ADDC. The control logic 121 may control an overall operation of the non-volatile memory device 120 based on the command CMD and the address ADD. The control logic 121 may generate the row address ADDR, and generate the column address ADDC based on the address ADD.

In some example embodiments, the control logic 121 may process a history read request, a normal read request, a read reclaim request, a read retry request, etc., based on the command CMD and the address ADD. The history read request may be used to request a read operation that is based on an optimized read voltage of history data. The normal read request may be used to request a read operation that is based on a default read voltage. The read reclaim request may be used to request an operation of copying data of a target memory block to another memory block. The read retry request may be used to request an operation of again reading data of a target memory block based on a changed read voltage when an uncorrectable error occurs in the read operation of the target memory block.

Under control of the control logic 121, the voltage generator 122 may control voltages to be applied to the memory cell array 124 through the row decoder 123.

The row decoder 123 may receive the row address ADDR from the control logic 121. The row decoder 123 may be connected with the memory cell array 124 through string selection lines SSL, word lines WL, and ground selection lines GSL. The row decoder 123 may decode the row address ADDR, and may control voltages to be applied to the string selection lines SSL, the word lines WL, and the ground selection lines GSL based on a decoding result and a voltage(s) received from the voltage generator 122.

The memory cell array 124 may include a plurality of memory blocks BLK. Each of the plurality of memory blocks BLK may be similar in structure to a memory block BLK illustrated in FIG. 4. The memory block BLK illustrated in FIG. 4 may correspond to a physical erase unit of the non-volatile memory device 120. In various example embodiments, the physical erase unit may be a page unit, a word line unit, a sub-block unit, or the like.

Referring to FIG. 4, the memory block BLK may include a plurality of cell strings CS11, CS12, CS21, and CS22, which may be arranged in a row direction and a column direction. For brevity of drawing, 4 cell strings CS11, CS12, CS21, and CS22 are illustrated in FIG. 4, but the number of cell strings may be increased or decreased in the row direction or the column direction.

Cell strings placed at the same column may be connected with the same bit line. For example, the cell strings CS11 and CS21 may be connected with a first bit line BL1, and the cell strings CS12 and CS22 may be connected with a second bit line BL2. Each of the plurality of cell strings CS11, CS12, CS21, and CS22 may include a plurality of cell transistors, which may be implemented with a charge trap flash (CTF) memory cell. The plurality of cell transistors may be stacked in a height direction (i.e., a direction perpendicular to a plane of a semiconductor substrate (not illustrated) defined by the row direction and the column direction).

The plurality of cell transistors may be connected in series between a corresponding bit line (e.g., BL1 or BL2) and a common source line CSL. The plurality of cell transistors may include string selection transistors SSTa and SSTb, dummy memory cells DMC1 and DMC2, memory cells MC1 to MC4, and ground selection transistors GSTa and GSTb. The serially-connected string selection transistors SSTa and SSTb may be provided between the serially-connected memory cells MC1 to MC4 and the corresponding bit line (e.g., BL1 and BL2).

The serially-connected ground selection transistors GSTa and GSTb may be provided between the serially-connected memory cells MC1 to MC4 and the common source line CSL. In some example embodiments, the second dummy memory cell DMC2 may be provided between the serially-connected string selection transistors SSTa and SSTb and the serially-connected memory cells MC1 to MC4, and the first dummy memory cell DMC1 may be provided between the serially-connected memory cells MC1 to MC4 and the serially-connected ground selection transistors GSTa and GSTb.

Memory cells placed at the same height may share the same word line. For example, the first memory cells MC1 of the plurality of cell strings CS11, CS12, CS21, and CS22 may be placed at the same height from the semiconductor substrate, and may share a first word line WL1. The second memory cells MC2 of the plurality of cell strings CS11, CS12, CS21, and CS22 may be placed at the same height from the semiconductor substrate and may share a second word line WL2. The third memory cells MC3 of the plurality of cell strings CS11, CS12, CS21, and CS22 may be placed at the same height from the semiconductor substrate and may share a third word line WL3. The fourth memory cells MC4 of the plurality of cell strings CS11, CS12, CS21, and CS22 may be placed at the same height from the semiconductor substrate and may share a fourth word line WL4.

Dummy memory cells placed at the same height may share the same dummy word line. For example, the first dummy memory cells DMC1 of the plurality of cell strings CS11, CS12, CS21, and CS22 may share a first dummy word line DWL1, and the second dummy memory cells DMC2 of the plurality of cell strings CS11, CS12, CS21, and CS22 may share a second dummy word line DWL2.

String selection transistors placed at the same height and the same row may be connected with the same string selection line. For example, the string selection transistors SSTb of the cell strings CS11 and CS12 may be connected with a string selection line SSL1b, and the string selection transistors SSTa of the cell strings CS11 and CS12 may be connected with a string selection line SSL1a. The string selection transistors SSTb of the cell strings CS21 and CS22 may be connected with a string selection line SSL2b, and the string selection transistors SSTa of the cell strings CS21 and CS22 may be connected with a string selection line SSL2a.

Ground selection transistors placed at the same height and the same row may be connected with the same ground selection line. For example, the ground selection transistors GSTb of the cell strings CS11 and CS12 may be connected with a ground selection line GSL1b, and the ground selection transistors GSTa of the cell strings CS11 and CS12 may be connected with a ground selection line GSL1a. The ground selection transistors GSTb of the cell strings CS21 and CS22 may be connected with a ground selection line GSL2b, and the ground selection transistors GSTa of the cell strings CS21 and CS22 may be connected with a ground selection line GSL2a.

The memory block BLK illustrated in FIG. 4 is merely an example, and the number of cell strings may be increased or decreased, and the number of rows of cell strings and the number of columns of cell strings may be increased or decreased depending on the number of cell strings. Also, in the memory block BLK, the number of cell transistors may be increased or decreased, the height of the memory block BLK may be increased or decreased depending on the number of cell transistors, and the number of lines connected with the cell transistors may be increased or decreased depending on the number of cell transistors.

In some example embodiments, the memory block BLK may include a plurality of memory pages. For example, the first memory cells MC1 of the cell strings CS11, CS12, CS21, and CS22 connected with the first word line WL1 may be referred to as a "first physical page". In some example embodiments, one physical page may correspond to a plurality of logical pages. For example, in the case where a memory cell is a triple level cell (TLC) storing information corresponding to 3 bits, a physical page may correspond to 3 logical pages. A multi-level cell storing two or more bits will be described in further detail with reference to FIGS. 5A, 5B, and 5C together.

Referring again to FIGS. 1 and 3, the page buffer unit 125 may include a plurality of page buffers PB. The page buffer unit 125 may be connected with the memory cell array 124 through the bit lines BL. The page buffer unit 125 may read data from the memory cell array 124 in units of page, by sensing voltages of the bit lines BL.

The column decoder 126 may receive the column address ADDC from the control logic 121. The column decoder 126 may decode the column address ADDC, and may provide the data read by the page buffer unit 125 to the I/O circuit 127 based on a decoding result.

The column decoder 126 may receive data from the I/O circuit 127 through data lines DL. The column decoder 126 may receive the column address ADDC from the control logic 121. The column decoder 126 may decode the column address ADDC, and may provide the data received from the I/O circuit 127 to the page buffer unit 125 based on a decoding result. The page buffer unit 125 may store the data provided from the I/O circuit 127 in the memory cell array 124 through the bit lines BL in units of page.

The I/O circuit 127 may be connected with the column decoder 126 through the data lines DL. The I/O circuit 127 may provide data received from the storage controller 110 to the column decoder 126 through the data lines DL. The I/O circuit 127 may output data received through the data lines DL to the storage controller 110.

In some example embodiments, the address ADD, the command CMD, and the data described with reference to FIG. 3 may be transmitted/received through the non-volatile memory interface circuit 119 of the storage controller 110 of FIG. 2.

Figure 5A:
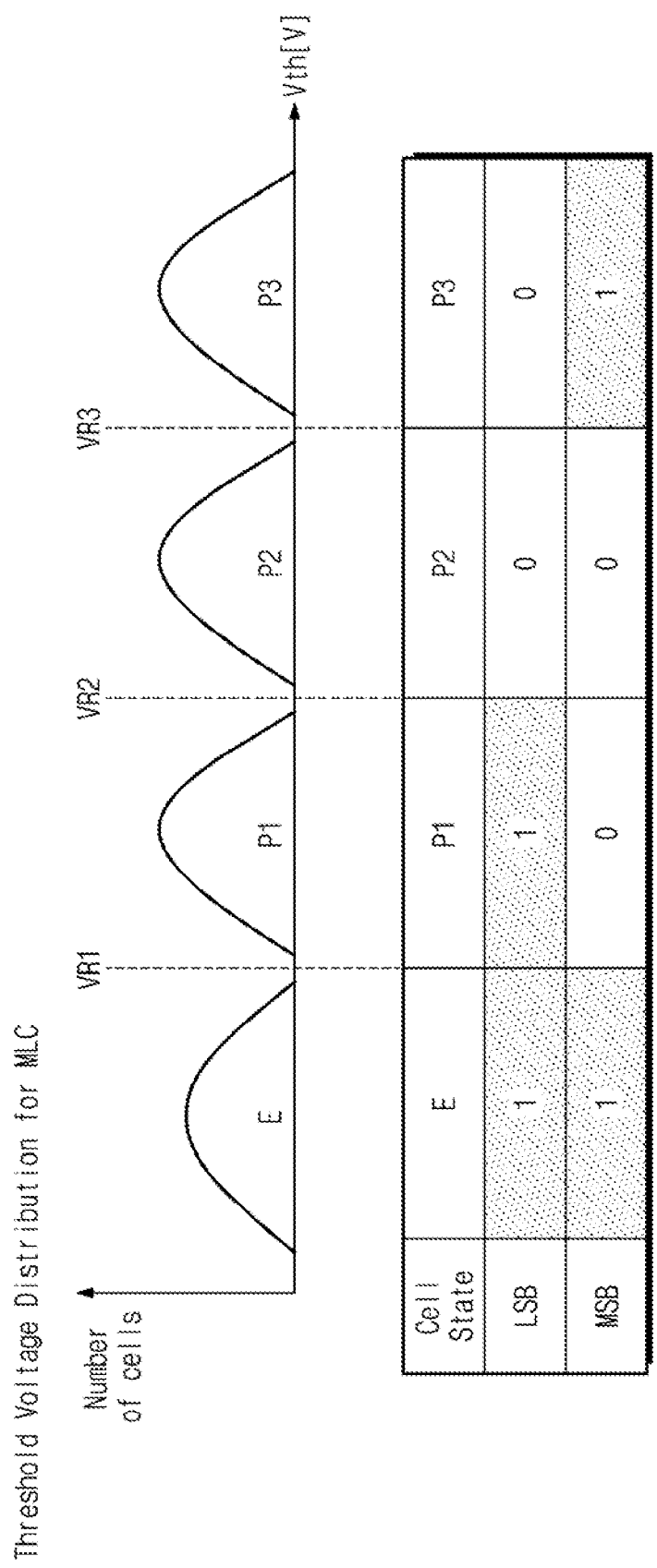
FIG. 5A is a diagram illustrating threshold voltage distributions of multi-level cells according to some example embodiments.

FIG. 5A is a diagram illustrating threshold voltage distributions of multi-level cells according to some example embodiments.

A graph of threshold voltage distributions of multi-level cells MLC each storing 2 bits and a bit table for each page corresponding to the threshold voltage distributions are illustrated in FIG. 5A. Below, for convenience of description, the multi-level cell MLC is intended to refer to a memory cell storing 2 bits, a memory cell storing 3 bits is referred to as a "triple level cell TLC", and a memory cell storing 4 bits is referred to as a "quadruple level cell QLC".

In the graph of the multi-level cell MLC, a horizontal axis represents a threshold voltage (e.g., a level of a threshold voltage), and a vertical axis represents the number of cells. The multi-level cell MLC may have one of an erase state "E" and first to third programming states P1, P2, and P3 in which the threshold voltage distributions sequentially increase.

In the multi-level cell MLC, a first read voltage VR1 may be a voltage for distinguishing the erase state "E" from the first programming state P1. A second read voltage VR2 may be a voltage for distinguishing the first programming state P1 from the second programming state P2. A third read voltage VR3 may be a voltage for distinguishing the second programming state P2 from the third programming state P3.

Referring to the table of the multi-level cell MLC, a most significant bit MSB and a least significant bit LSB according to a cell state are illustrated. A physical page corresponding to the multi-level cell MLC storing 2 bits may correspond to a first logical page and a second logical page. In the multi-level cell MLC, the first logical page may indicate the least significant bit LSB, and the second logical page may indicate the most significant bit MSB.

In some example embodiments, each of the first to third read voltages VR1 to VR3 of the multi-level cell MLC may correspond to one of a plurality of logical pages. For example, in the multi-level cell MLC, a read operation corresponding to the first logical page may be performed based on the second read voltage VR2. A read operation corresponding to the second logical page may be performed based on the first read voltage VR1 and the third read voltage VR3.

Figure 5B:
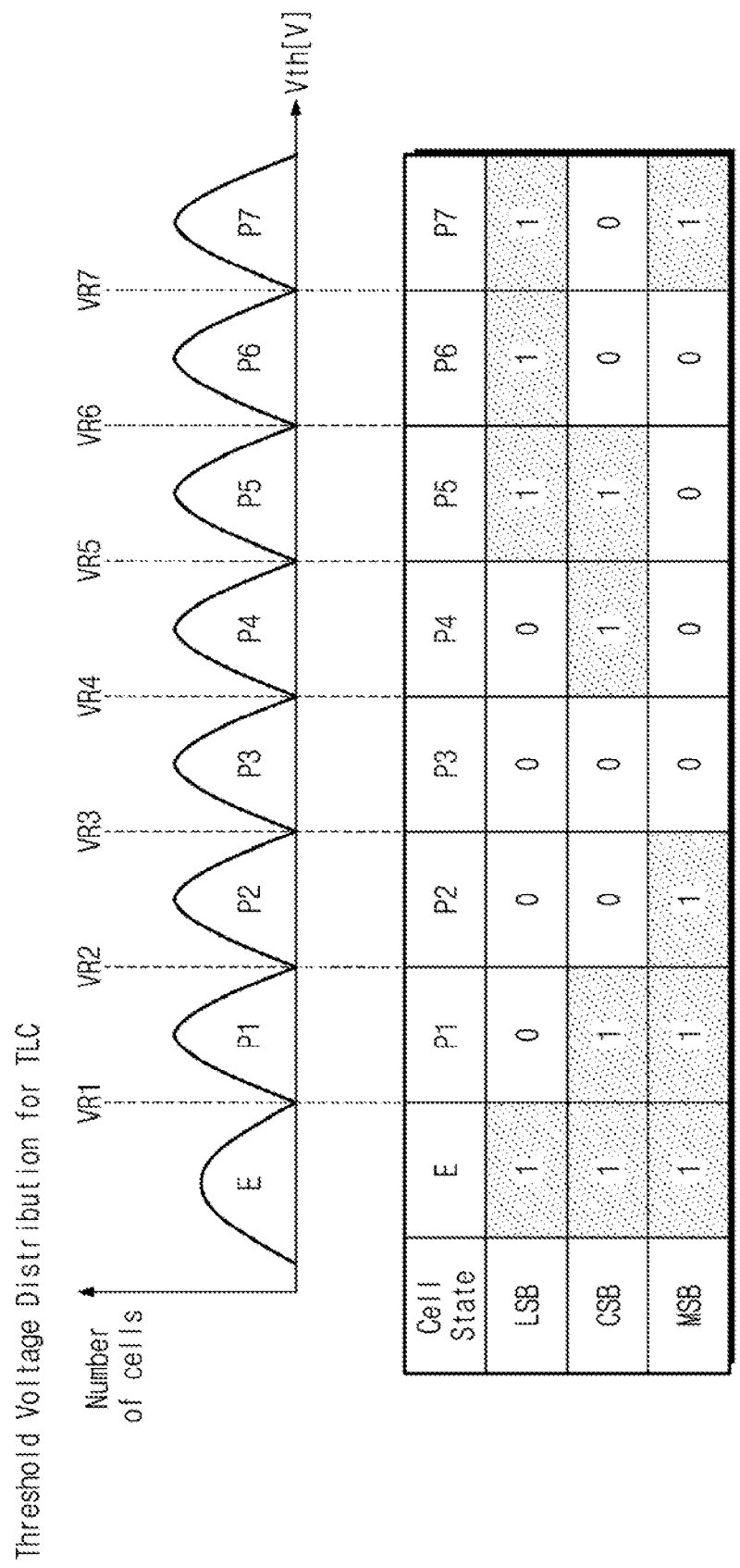
FIG. 5B is a diagram illustrating threshold voltage distributions of triple level cells according to some example embodiments.

FIG. 5B is a diagram illustrating threshold voltage distributions of triple level cells according to some example embodiments.

A graph of threshold voltage distributions of the triple level cells TLC each storing 3 bits and a bit table for each page corresponding to the threshold voltage distributions are illustrated in FIG. 5B.

In the graph of the triple level cell TLC, a horizontal axis represents a threshold voltage (e.g., a level of a threshold voltage), and a vertical axis represents the number of cells. The triple level cell TLC may have one of an erase state "E" and first to seventh programming states P1, P2, P3, P4, P5, P6, and P7 in which threshold voltage distributions sequentially increase.

In the triple level cell TLC, a first read voltage VR1 may be a voltage for distinguishing the erase state "E" from the first programming state P1. Likewise, each of second to seventh read voltages VR2 to VR7 may be a voltage for distinguishing each of the second to seventh programming states P2 to P7 from a previous state (i.e., an immediately previous state having a low threshold voltage distribution).

Referring to the table of the triple level cell TLC, a least significant bit LSB, a center significant bit CSB, and a most significant bit MSB according to a cell state are illustrated. A physical page corresponding to the triple level cell TLC storing 3 bits may correspond to a first logical page, a second logical page, and a third logical page. In the triple level cell TLC, the first logical page may indicate the least significant bit LSB, the second logical page may indicate the center significant bit CSB, and the third logical page may indicate the most significant bit MSB.

In some example embodiments, each of the first to seventh read voltages VR1 to VR7 of the triple level cell TLC may correspond to one of a plurality of logical pages. For example, in the triple level cell TLC, a read operation corresponding to the first logical page may be performed based on the first read voltage VR1 and the fifth read voltage VR5. A read operation corresponding to the second logical page may be performed based on the second read voltage VR2, the fourth read voltage VR4, and the sixth read voltage VR6. A read operation corresponding to the third logical page may be performed based on the third read voltage VR3 and the seventh read voltage VR7.

Figure 5C:
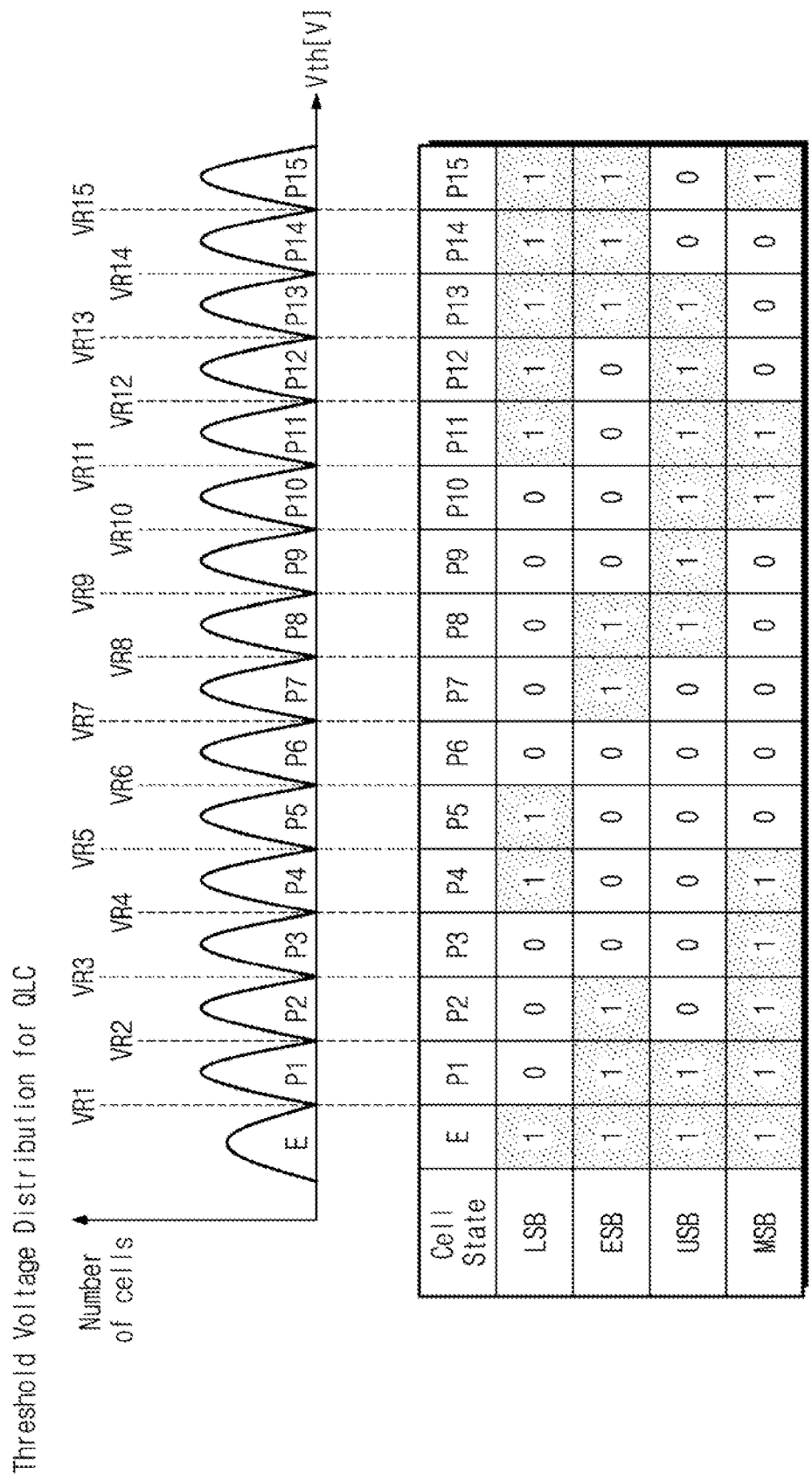
FIG. 5C is a diagram illustrating threshold voltage distributions for quadruple level cells, according to some example embodiments.

FIG. 5C is a diagram illustrating threshold voltage distributions for quadruple level cells, according to some example embodiments.

A graph of threshold voltage distributions of the quadruple level cells QLC each storing 4 bits and a bit table for each page corresponding to the threshold voltage distributions are illustrated in FIG. 5C.

In the graph of the quadruple level cell QLC, a horizontal axis represents a threshold voltage (e.g., a level of a threshold voltage), and a vertical axis represents the number of cells. The quadruple level cell QLC may have one of an erase state "E" and first to fifteenth programming states P1, P2, P3, P4, P5, P6, P7, P8, P9, P10, P11, P12, P13, P14, and P15 in which threshold voltage distributions sequentially increase.

In the quadruple level cell QLC, a first read voltage VR1 may be a voltage for distinguishing the erase state "E" from the first programming state P1. Likewise, each of second to fifteenth read voltages VR2 to VR15 may be a voltage for distinguishing each of the second to fifteenth programming states P2 to P15 from a previous state (i.e., an immediately previous state having a low threshold voltage distribution).

Referring to the table of the quadruple level cell QLC, a least significant bit LSB, a first center significant bit ESB, a second center significant bit USB, and a most significant bit MSB according to a cell state are illustrated. A physical page corresponding to the quadruple level cell QLC storing 4 bits may correspond to a first logical page, a second logical page, a third logical page, and a fourth logical page. In the quadruple level cell QLC, the first logical page may indicate the least significant bit LSB, the second logical page may indicate the first center significant bit ESB, the third logical page may indicate the second center significant bit USB, and the fourth logical page may indicate the most significant bit MSB.

In some example embodiments, each of the first to fifteenth read voltages VR1 to VR15 of the quadruple level cell QLC may correspond to one of a plurality of logical pages. For example, in the quadruple level cell QLC, a read operation corresponding to the first logical page may be performed based on the first, fourth, sixth, and eleventh read voltages VR1, VR4, VR6, and VR11. A read operation corresponding to the second logical page may be performed based on the third, seventh, ninth, and thirteenth read voltages VR3, VR7, VR9, and VR13. A read operation corresponding to the third logical page may be performed based on the second, eighth, and fourteenth read voltages VR2, VR8, and VR14. A read operation corresponding to the fourth logical page may be performed based on the fifth, tenth, twelfth, and fifteenth read voltages VR5, VR10, VR12, and VR15.

The states and the read voltages of the multi-level cell MLC, the triple level cell TLC, and the quadruple level cell QLC are described with reference to FIGS. 5A, 5B, and 5C, as examples, but read voltages corresponding to each logical page may be variously changed or modified, and one memory cell may store, e.g., 5 or more bits.

Figure 6:
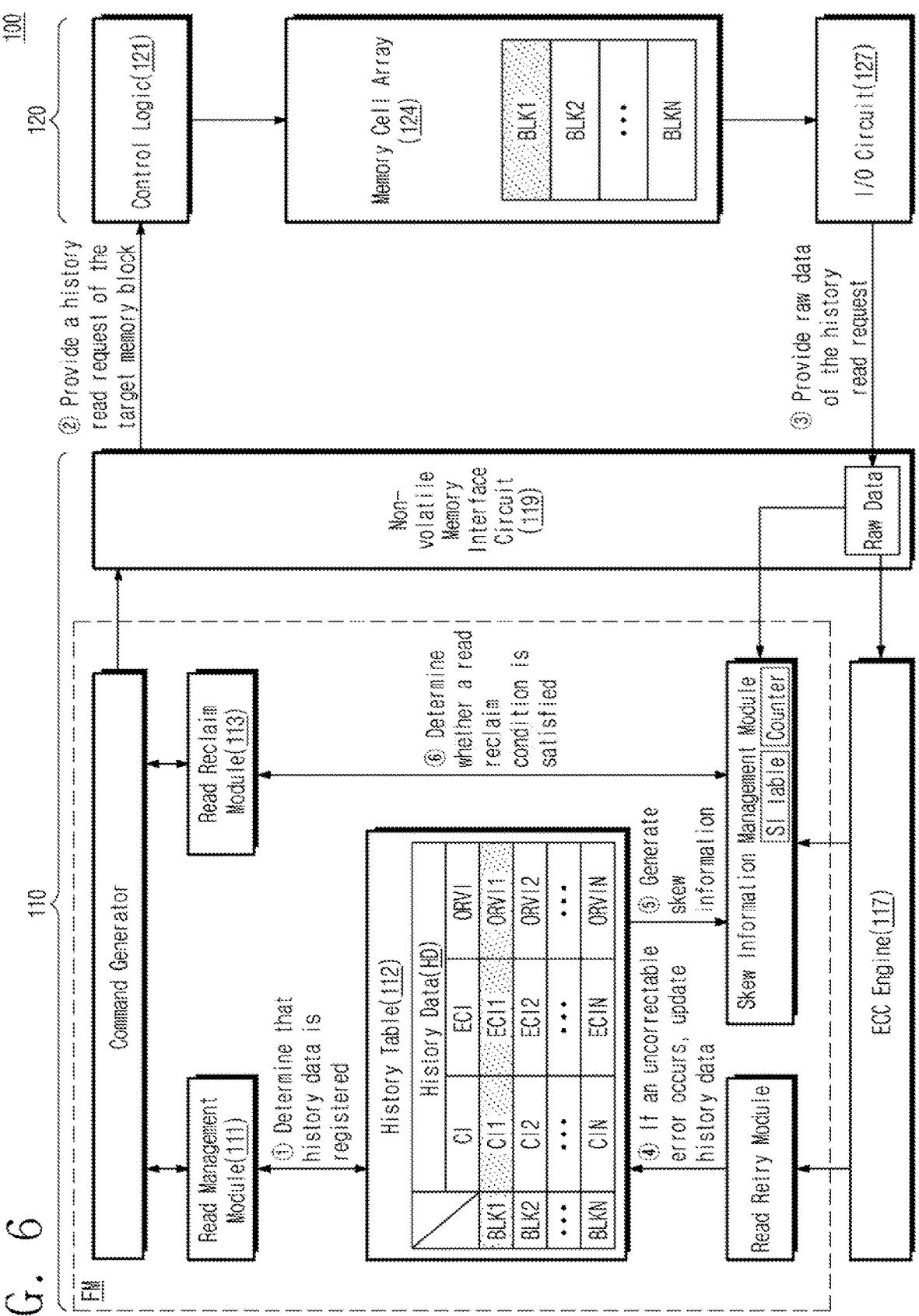
FIG. 6 is a diagram describing a method of operating a storage device according to some example embodiments.

FIG. 6 is a diagram describing a method of operating a storage device according to some example embodiments.

Referring to FIG. 6, the storage device 100 may include the storage controller 110 and the non-volatile memory device 120. The storage device 100 may correspond to the storage device 100 of FIG. 1.

The storage controller 110 may include the firmware memory FM, the ECC engine 117, and the non-volatile memory interface circuit 119. The firmware memory FM may include the read management module 111, the history table 112, the read reclaim module 113, a command generator, a read retry module, and a skew information management module. In some example embodiments, sub-components of the firmware memory FM may be implemented with a separate hardware device(s). The read management module 111 and the read reclaim module 113 are similar to the read management module 111 and the read reclaim module 113 of FIG. 1, and thus, additional description will be omitted to avoid redundancy.

The history table 112 may manage history data HD. The history table 112 may manage a plurality of history data HD respectively corresponding to the plurality of memory blocks BLK1 to BLKN.

The history data HD may include count information CI, error count information ECI, and optimized read voltage information ORVI. The count information CI may include a value corresponding to a result of counting the number of memory cells having the first bit value from among memory cells each having the first bit value or the second bit value. The error count information ECI may include a value corresponding to a result of counting the number of memory cells error-corrected by the ECC engine 117. The optimized read voltage information ORVI may include a level of an optimized read voltage corresponding to the count information CI or the error count information ECI.

In other example embodiments, the history data HD may be implemented to include all of the count information CI, the error count information ECI, and the optimized read voltage information ORVI, may be implemented to include the count information CI and the optimized read voltage information ORVI, or may be implemented to include the error count information ECI and the optimized read voltage information ORVI.

In some example embodiments, the history table 112 may manage history data HD in an accumulation scheme. For example, in the case where the history data HD of the history table 112 are updated, a value corresponding to the variations in new count information with respect to previous count information, or a value corresponding to the variations in new error count information with respect to previous error count information, may be further stored with existing history data maintained.

The command generator may generate a command indicating an operation to be performed by the non-volatile memory device 120, such as a read operation, a write operation, or an erase operation. The command generator may generate a command indicating the history read request or the normal read request under control of the read management module 111. The command generator may generate a command including the read reclaim request under control of the read reclaim module 113. A connection relationship is omitted in FIG. 6 to prevent the drawing from being overly complicated, but the command generator may generate the command indicating the read retry request under control of the read retry module.

The read retry module may determine whether a read retry operation for a target memory block is called for, based on the communication with the ECC engine 117. For example, the ECC engine 117 may determine that raw data of the target memory block have an uncorrectable error. The read retry module may determine that the read retry operation for the target memory block is called for, based on the communication with the ECC engine 117. The read retry module may allow the command generator to provide the non-volatile memory device 120 with the command indicating the read retry request.

In some example embodiments, the read retry module may update the history data HD of the history table 112. For example, when the ECC engine 117 determines that raw data read through the history read operation have an uncorrectable error, the read retry module may request the read retry operation based on a changed read voltage. When the ECC engine 117 determines that raw data read through the history read operation do not have an uncorrectable error, the read retry module may update the history data HD of the history table 112 based on the raw data read through the read retry operation.

The skew information management module may communicate with the history table 112, the non-volatile memory interface circuit 119, and the ECC engine 117. The skew information management module may receive raw data from the non-volatile memory device 120 through the non-volatile memory interface circuit 119. The skew information management module may receive the history data HD from the history table 112. The skew information management module may generate skew information based on the raw data and the history data HD. The skew information management module may provide the skew information to the read reclaim module 113. The skew information may indicate the variations of the count information CI or the variations of the error count information ECI.

The read reclaim module 113 may determine whether a read reclaim condition for a target memory block is satisfied, based on the skew information.

In an example embodiment, the history data HD may include a value of first count information of a target memory block based on a previous read operation. The raw data received through the non-volatile memory interface circuit 119 may include a value of second count information of the target memory block based on the history read operation. The skew information management module may generate the skew information by subtracting the value of the second count information from the value of the first count information. The skew information management module may store the skew information in the history table 112.

As another example, the history data HD may include a value of first error count information of a target memory block based on the previous read operation. The ECC engine 117 may generate a value of second error count information of the target memory block based on the raw data read through the history read operation. The skew information management module may generate the skew information by subtracting the value of the second error count information from the value of the first error count information. The skew information management module may store the skew information in the history table 112.

In some example embodiments, the skew information management module may include a skew information (SI) table and a counter. The skew information table may accumulate and store the skew information whenever the raw data read through the history read request are received. The counter may generate a value of count information from the raw data received through the non-volatile memory interface circuit 119. The counter may generate error count information of the raw data based on information about error correction received from the ECC engine 117.

The ECC engine 117 may communicate with the read retry module, the skew information management module, and the non-volatile memory interface circuit 119. The ECC engine 117 may perform error correction on the raw data received through the non-volatile memory interface circuit 119. The ECC engine 117 may notify the read retry module whether an uncorrectable error occurs, based on the error correction. The ECC engine 117 may provide information about the error correction of the raw data to the skew information management module.

The non-volatile memory device 120 may include the control logic 121, the memory cell array 124, and the I/O circuit 127. The memory cell array 124 may include the plurality of memory blocks BLK1 to BLKN. The control logic 121, the memory cell array 124, the I/O circuit 127 are similar to the control logic 121, the memory cell array 124, and the I/O circuit 127 of FIG. 3, and thus, additional description will be omitted to avoid redundancy.

A history read operation of the storage device 100 according to some example embodiments will now be described with reference to operations ① to ⑥ in FIG. 6.

In a first operation ①, the read management module 111 may start the read operation. The read management module 111 may determine whether history data of a target memory block are registered at the history table 112. For example, the target memory block may be the first memory block BLK1, and the read management module 111 may determine that the history data HD of the first memory block BLK1 are registered at the history table 112.

In a second operation ②, the read management module 111 may provide the history read request for the target memory block whose history data are registered. The history read request may request a read operation based on the optimized read voltage information ORVI of the history data HD and a target memory block on which the read operation is to be performed. The non-volatile memory device 120 may perform the history read operation.

For example, the read management module 111 may control the command generator such that the history read request of the first memory block BLK1 is provided to the non-volatile memory device 120 through the non-volatile memory interface circuit 119. The control logic 121 may perform the history read operation on the first memory block BLK1 of the memory cell array 124 based on a level of the optimized read voltage included in the history read request.

In a third operation ③, the non-volatile memory device 120 may provide raw data corresponding to the history read request to the storage controller 110. For example, an electrical signal corresponding to the raw data may be provided to the I/O circuit 127 from the first memory block BLK1 of the memory cell array 124 to which the optimized read voltage is applied under the control of the control logic 121. The I/O circuit 127 may provide the storage controller 110 with the raw data corresponding to the history read request, based on the electrical signal received from the first memory block BLK1.

When an error of the raw data is uncorrectable, in a fourth operation ④, the read retry module may perform the read retry operation and may then update the history data HD of the history table 112. The fourth operation ④ may be omitted when an error of the raw data read through the history read operation is correctable.

For example, the ECC engine 117 may perform error correction on the raw data received in the third operation ③. When the error of the raw data is uncorrectable, the ECC engine 117 may notify the read retry module that the error of the raw data is uncorrectable. The read retry module may have a request to the command generator for the read retry operation using a changed read voltage. The storage controller may receive raw data read through the read retry operation from the non-volatile memory device 120. When it is determined that the raw data read through the read retry operation does not include an uncorrectable error, the ECC engine 117 may notify a determination result of the read retry module. When it is determined that the raw data read through the read retry operation does not include an uncorrectable error, the read retry module may update the history data HD of the history table 112.

In a fifth operation ⑤, the skew information management module may receive raw data from the non-volatile memory interface circuit 119. The skew information management module may receive the history data HD from the history table 112. The skew information management module may generate skew information based on the raw data and the history data HD. The skew information may indicate the variations of the count information CI or the variations of the error count information ECI.

For example, the skew information management module may generate skew information including the variations of the count information CI with reference to the history data HD of the history table 112 and the raw data of the non-volatile memory interface circuit 119. In this case, the storage controller 110 may obtain the skew information by determining bit values of memory cells in units of logical page from the raw data, without performing any other additional read operation other than the read operation in the first operation ①, for the purpose of generating the skew information.

As another example, the skew information management module may generate the skew information including the variations of the error count information ECI based on the history data HD of the history table 112 and information about error correction of the raw data received from the ECC engine 117. In this case, the storage controller 110 may obtain the skew information by utilizing error count information obtained through the error correction of the raw data, without performing any other additional read operation other than the read operation in the first operation ①, for the purpose of generating the skew information.

In a sixth operation ⑥, the read reclaim module 113 may determine whether the read reclaim condition for the target memory block is satisfied, based on the skew information. For example, based on the skew information generated by the skew information management module, the read reclaim module 113 may determine whether the read reclaim operation for the first memory block BLK1 is called for. When it is determined that the read reclaim operation is not called for, the read reclaim module 113 may terminate the read operation. When it is determined that the read reclaim operation is called for, the read reclaim module 113 may provide the non-volatile memory device 120 with the read reclaim request for the target memory block.

Figure 7:
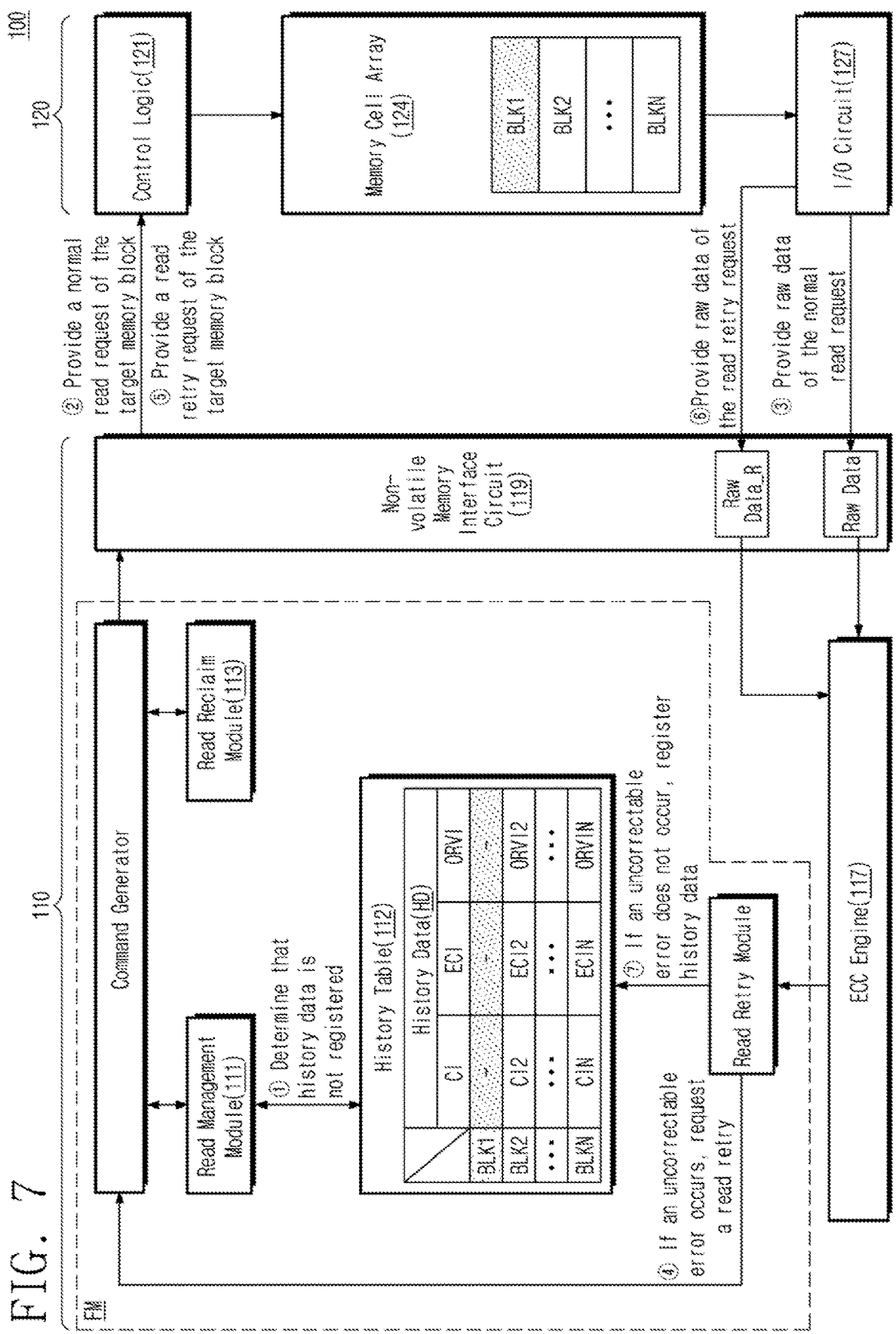
FIG. 7 is a diagram describing a method of operating a storage device according to some example embodiments.

FIG. 7 is a diagram describing a method of operating a storage device according to some example embodiments.

Referring to FIG. 7, the storage device 100 may include the storage controller 110 and the non-volatile memory device 120. The storage controller 110 may include the firmware memory FM, the ECC engine 117, and the non-volatile memory interface circuit 119. The firmware memory FM may include the read management module 111, the history table 112, the read reclaim module 113, the command generator, and the read retry module. The non-volatile memory device 120 may include the control logic 121, the memory cell array 124, and the I/O circuit 127. The storage controller 110 and the non-volatile memory device 120 may respectively correspond to the storage controller 110 and the non-volatile memory device 120 of FIG. 6.

A normal read operation of the storage device 100 according to some example embodiments will now be described with reference to operations ① to ⑦ in FIG. 7.

In a first operation ①, the read management module 111 may start the read operation. The read management module 111 may determine whether history data of a target memory block are registered at the history table 112. For example, the target memory block may be the first memory block BLK1, and the read management module 111 may determine that the history data HD of the first memory block BLK1 are not registered at the history table 112.

In a second operation ②, the read management module 111 may provide the normal read request for the target memory block whose history data are not registered. The normal read request may request a read operation that is based on a default read voltage, and a location of the target memory block on which the read operation is to be performed. The non-volatile memory device 120 may perform the normal read operation.

In a third operation ③, the non-volatile memory device 120 may provide raw data corresponding to the normal read request to the storage controller 110. For example, an electrical signal corresponding to the raw data may be provided to the I/O circuit 127 from the first memory block BLK1 of the memory cell array 124 to which the default read voltage is applied under the control of the control logic 121. The I/O circuit 127 may provide the storage controller 110 with the raw data corresponding to the normal read request, based on the electrical signal received from the first memory block BLK1.

When an error of the raw data read through the normal read request is uncorrectable, in a fourth operation ④, the read retry module may request the read retry operation. For example, the ECC engine 117 may receive the raw data read through the normal read request from the non-volatile memory interface circuit 119. The ECC engine 117 may determine whether an error of the raw data is uncorrectable, by performing error correction on the raw data. When it is determined that the error of the raw data is correctable, the storage controller 110 may not register history data of the target memory block. When it is determined that the error of the raw data is uncorrectable, the ECC engine 117 may notify the read retry module that the error of the target memory block is uncorrectable.

In a fifth operation ⑤, the read reclaim module 113 may provide the non-volatile memory device 120 with the read retry request for the target memory block. For example, when the error of the raw data are incapable of being corrected by the ECC engine 117, the read retry module may determine that the read retry operation for the target memory block is called for. The read retry module may allow the command generator to provide the non-volatile memory device 120 with the read retry request for the target memory block. The non-volatile memory device 120 may perform the read retry operation on the target memory block based on a changed read voltage.

In a sixth operation ⑥, the storage controller 110 may receive raw data Raw Data_R corresponding to the read retry request from the non-volatile memory device 120.

When an error of the raw data Raw Data_R is correctable by the ECC engine 117, in a seventh operation ⑦, the read retry module may register the history data HD at the history table 112.

For example, the ECC engine 117 may determine whether an error of the raw data Raw Data_R received through the sixth operation ⑥ is uncorrectable. When it is determined that the error of the raw data Raw Data_R is uncorrectable, the ECC engine 117 may further perform the read retry operation or may regard the target memory block as a bad block such that the read operation is terminated. When it is determined that an error of new raw data is correctable, the ECC engine 117 may request the read retry module to register history data.

When the request for registering the history data is received from the ECC engine 117, the read retry module may generate the history data HD of the target memory block based on the raw data Raw Data_R read through the read retry request. The read retry module may register the history data HD of the target memory block at the history table 112. The history data HD may be used to perform a next history read operation or to generate skew information.

FIG. 8 is a diagram describing a history table according to some example embodiments.

The history table 112 according to some example embodiments will be described with reference to FIG. 8. The history table 112 may correspond to the history table 112 of FIGS. 1, 2, 6, and 7.

In some example embodiments, the history table 112 may manage the count information CI and the error count information ECI for each page type. The history table 112 may manage the optimized read voltage information ORVI for each read voltage type.

Below, by way of example, an example embodiment is described in which memory cells of a target memory block are implemented with a triple level cell (TLC).

The history table 112 may manage the history data HD of each of the plurality of memory blocks BLK1 to BLKN. The history data HD of the first memory block BLK1 may include the count information CI and the error count information ECI for each page type. The page type may be used to distinguish different logical pages. For example, the page type may include first, second, and third types. The first type may correspond to a first logical page to which the least significant bit LSB belongs. The second type may correspond to a second logical page to which the center significant bit CSB belongs. The third type may correspond to a third logical page to which the most significant bit MSB belongs (refer to FIG. 5B).

The count information CI of the first memory block BLK1 may include values CI1-LSB, CI1-CSB, and CI1-MSB, respectively corresponding to the first to third types.

The error count information CI of the first memory block BLK1 may include values ECI1-LSB, ECI1-CSB, and ECI1-MSB, respectively corresponding to the first to third types.

The optimized read voltage information ORVI of the first memory block BLK1 may include information corresponding to each of different read voltage types. The read voltage type may be used to distinguish different programming states. For example, the first type of the page type may correspond to the first read voltage VR1 and the fifth read voltage VR5. The second type of the page type may include the second read voltage VR2, the fourth read voltage VR4, and the sixth read voltage VR6. The third type of the page type may correspond to the third read voltage VR3 and the seventh read voltage VR7. The optimized read voltage information ORVI of the first memory block BLK1 may include information about levels OVRI1-VR1 to OVRI1-VR7 of first to seventh optimized read voltages respectively corresponding to the types of the first to seventh read voltages VR1 to VR7. The optimized read voltage information ORVI of the first memory block BLK1 may be accumulated whenever the history data HD are updated.

As in the above description given with reference to the first memory block BLK1, the history data HD of each of the second to N-th memory blocks BLK2 to BLKN may include the count information CI and the error count information ECI for each page type, and may include the optimized read voltage information ORVI for each read voltage type.

FIG. 9 is a diagram describing a change of a threshold voltage distribution according to some example embodiments.

Threshold voltage distributions of an initial state and threshold voltage distributions of a retention state will be described with reference to FIG. 9. In FIG. 9, a horizontal axis represents a threshold voltage, and a vertical axis represents the number of memory cells. By way of example, an example embodiment of the least significant bit LSB of the triple level cell TLC will be described.

The initial state may be a state immediately after a threshold voltage level of a memory cell is programmed. Referring to the graph corresponding to the initial state, each memory cell of a memory block may have a threshold voltage corresponding to one of the erase state "E" and the first to seventh programming states P1 to P7. A threshold voltage of a memory cell may be different from an initially programmed threshold voltage due to various factors such as a characteristic of the memory cell and a voltage of a word line adjacent to the memory cell.

Memory cells corresponding to region x1 may be programmed to the first programming state P1 but may have a threshold voltage level corresponding to the erase state "E" in the initial state. Memory cells corresponding to region y1 may be programmed to the fifth programming state P5 but may have a threshold voltage level corresponding to the fourth programming state P4 in the initial state.

As a width of region x1 increases, the number of memory cells having the first value (e.g., "1") may increase when the least significant bits LSB of the triple level cells TLC are read. As a width of region y1 increases, the number of memory cells having the second value (e.g., "0") may increase when the least significant bits LSB of the triple level cells TLC are read.

The retention state may be a state in which a threshold voltage level of a memory cell is decreased as a time passes from the time when the threshold voltage level of the memory cell is programmed. Referring to the graph corresponding to the retention state, each memory cell of a memory block may have a threshold voltage corresponding to one of the erase state "E" and the first to seventh programming states P1 to P7. A threshold voltage level of a memory cell may be lower than the threshold voltage level of the initial state as a time passes. As the threshold voltage level becomes higher, the degree to which the threshold voltage level is decreased may increase. For example, the decrement of threshold voltage levels of memory cells in the fifth programming state P5 may be greater than the decrement of threshold voltage levels of memory cells in the first programming state P1.

Memory cells corresponding to region x2 may be programmed to the first programming state P1 but may have a threshold voltage level corresponding to the erase state "E" in the retention state. Memory cells corresponding to region y2 may be programmed to the fifth programming state P5 but may have a threshold voltage level corresponding to the fourth programming state P4 in the retention state.

As a width of region x2 increases, the number of memory cells having the first value may increase when the least significant bits LSB of the triple level cells TLC are read. As a width of region y2 increases, the number of memory cells having the second value may increase when the least significant bits LSB of the triple level cells TLC are read.

Referring to the graphs of the initial state and the retention states, the width of region x2 may be greater than the width of region x1. The width of region y2 may be greater than the width of region y1. The width of region y2 may be greater than the width of region x2. That is, compared to the case of the initial state, the retention state may have an increasing tendency of the number of memory cells having the second value.

In other words, in the retention state (e.g., as a time passes from the programmed time), a value of count information corresponding to the least significant bit LSB of the triple level cell TLC (e.g., the number of memory cells having the first value) may decrease. However, this is merely used as an example and, e.g., a value of count information in the retention state may increase depending on a page type. For example, unlike the embodiment of FIG. 9, in the case of reading the center significant bits CSB of the triple level cells TLC, the decrement of threshold voltage levels of memory cells in the sixth programming state P6 may be greater than the decrement of threshold voltage levels of memory cells in the fourth programming state P4. As such, a value of count information may increase in the retention state (refer to FIG. 5B).

Figure 10:
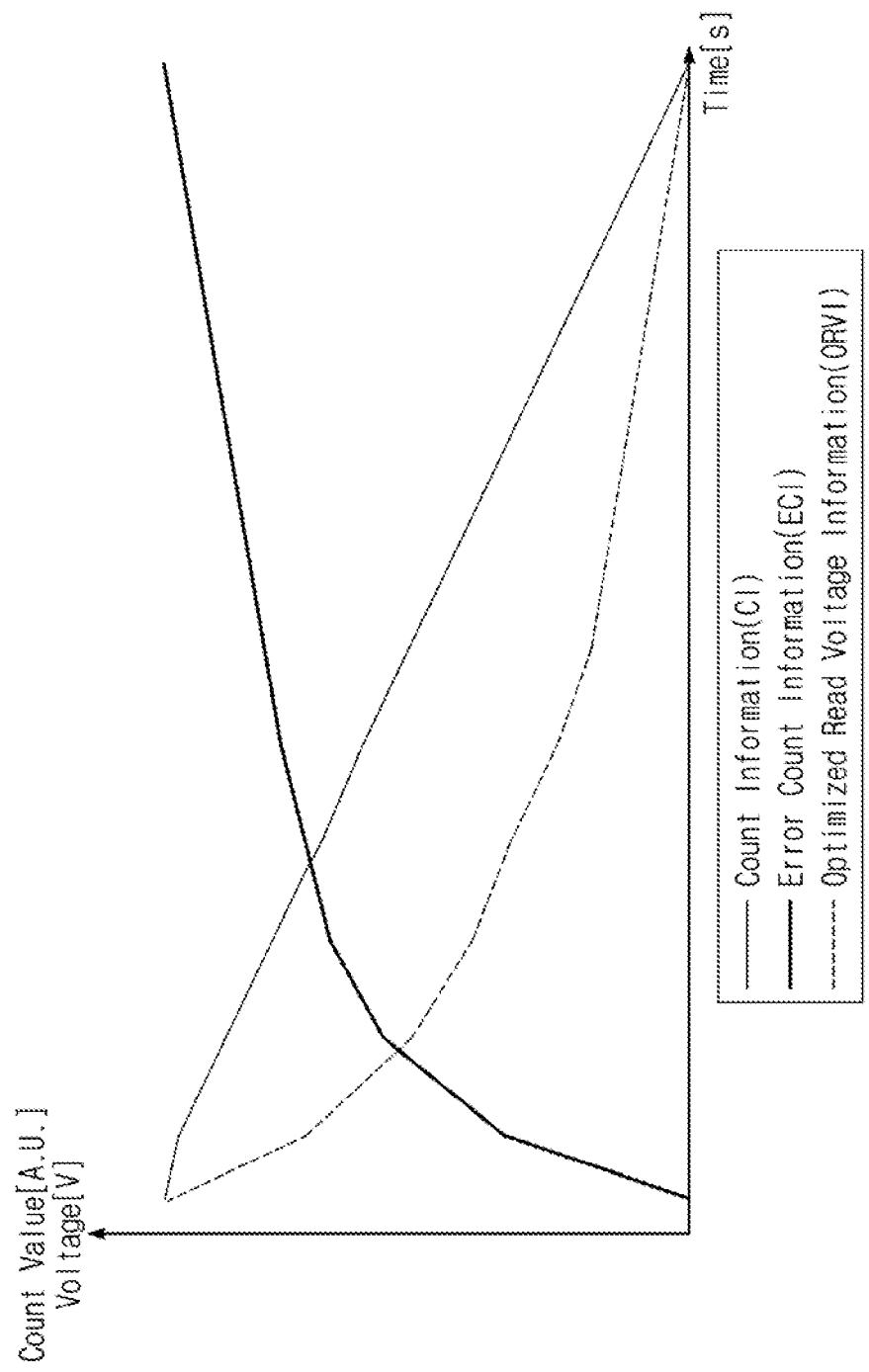
FIG. 10 is a graph describing count information, error count information, and optimized read voltage information according to some example embodiments.

FIG. 10 is a graph describing count information, error count information, and optimized read voltage information according to some example embodiments.

Waveforms of the count information CI, the error count information ECI, and the optimized read voltage information ORVI will be described with reference to FIG. 10. In FIG. 10, a solid line indicates the waveform of the count information CI, a thick solid line indicates the waveform of the error count information ECI, and a dotted line indicates the waveform of the optimized read voltage information ORVI. The count information CI, the error count information ECI, and the optimized read voltage information ORVI may respectively correspond to the count information CI, the error count information ECI, and the optimized read voltage information ORVI of FIGS. 6, 7, and 8. In FIG. 10, a horizontal axis represents a time, and a vertical axis represents a count value corresponding to the count information CI and the error count information ECI and a voltage level corresponding to the optimized read voltage information ORVI.

In some example embodiments, as a time passes from the time when threshold voltage levels of memory cells of a target memory block are programmed, a value of the count information CI may decrease, a value of the error count information ECI may increase, and a voltage level of the optimized read voltage information ORVI may decrease.

In other example embodiments, unlike the example of FIG. 10, as a time passes from the time when the threshold voltage levels of the memory cells of the target memory block are programmed, a value of the count information CI may increase. Whether a value of the count information CI increases as a time passes may be determined based on a page type. For example, as a time passes, a value of the count information CI corresponding to the least significant bit LSB of the triple level cell TLC may increase. As another example, as a time passes, a value of the count information CI corresponding to the center significant bit CSB of the triple level cell TLC may decrease (refer to FIGS. 5B and 9).

As described above, according to example embodiments, the count information CI, the error count information ECI, and the optimized read voltage information ORVI may have a correlation. A storage controller according to an example embodiment may manage history data based on the correlation of the count information CI, the error count information ECI, and the optimized read voltage information ORVI. For example, the storage controller may predict the error count information ECI based on the count information CI, or may predict the optimized read voltage information ORVI based on the count information CI.

Figure 11:
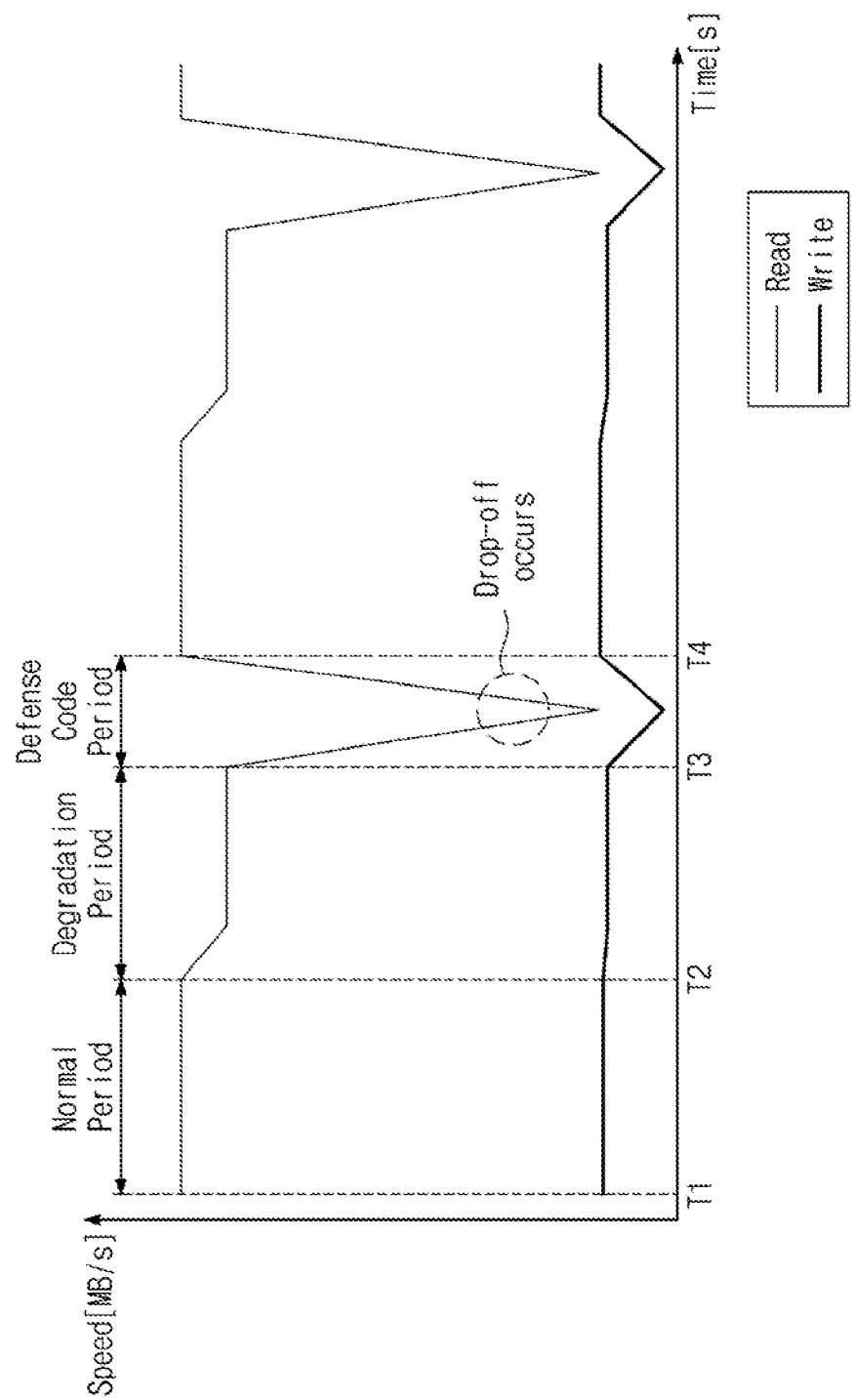
FIG. 11 is a graph describing a performance characteristic of a general storage device.

FIG. 11 is a graph describing a performance characteristic of a general storage device.

A performance characteristic of a general storage device will be described with reference to FIG. 11, as a comparative example.

In FIG. 11, the performance characteristic may indicate a data I/O speed in a storage device. A solid line indicates the performance characteristic of the read operation. A thick solid line indicates the performance characteristic of the write operation. A horizontal axis represents a time, and a vertical axis represents a speed.

A general storage device may operate sequentially in a normal period, a degradation period, and a defense code period. The normal period may be a period in which the degradation of the performance characteristic does not occur. The degradation period may be a period in which the degradation of the performance characteristic occurs. The defense code period may be a period in which a defense code is executed depending on the serious degradation of the performance characteristic. The defense code, which is an instruction stored in a firmware memory, may perform operations of preventing or recovering an error of data.

A period between a first point in time T1 and a second point in time T2 is the normal period. In the normal period, the performance characteristic of the read operation may be maintained uniformly or at almost a uniformly high level, and the performance characteristic of the write operation may be maintained uniformly or at almost a uniformly high level.

A period between the second point in time T2 and a third point in time T3 is the degradation period. The degradation period may be a period in which the degradation of the performance characteristic occurs, but an uncorrectable error does not occur. In the degradation period, the performance characteristic of the read operation may be somewhat lower than the performance characteristic of the read operation in the normal period, and the performance characteristic of the write operation may be somewhat lower than the performance characteristic of the write operation in the normal period. For example, the performance characteristic in the degradation period may be about 90% of the performance characteristic in the normal period.

A period between the third point in time T3 and a fourth point in time T4 is the defense code period. The defense code period may be a period in which the serious degradation of the performance characteristic occurs and a general read reclaim operation (e.g., an ex-post read reclaim operation not associated with history data) is performed based on the detection of an uncorrectable error. In the defense code period, the performance characteristic of the read operation may be much lower than the performance characteristic of the read operation in the normal period, and the performance characteristic of the write operation may be much lower than the performance characteristic of the write operation in the normal period. For example, the performance characteristic in the defense code period may be about 20% of the performance characteristic in the normal period. That is, the performance drop-off of the target memory block may occur in the defense code period.

When the performance drop-off occurs, the reliability of data of the storage device may be reduced, and a data processing speed may decrease. To avoid this issue, example embodiments may provide a technique for performing the read reclaim operation before entering the defense code period.

Figure 12:
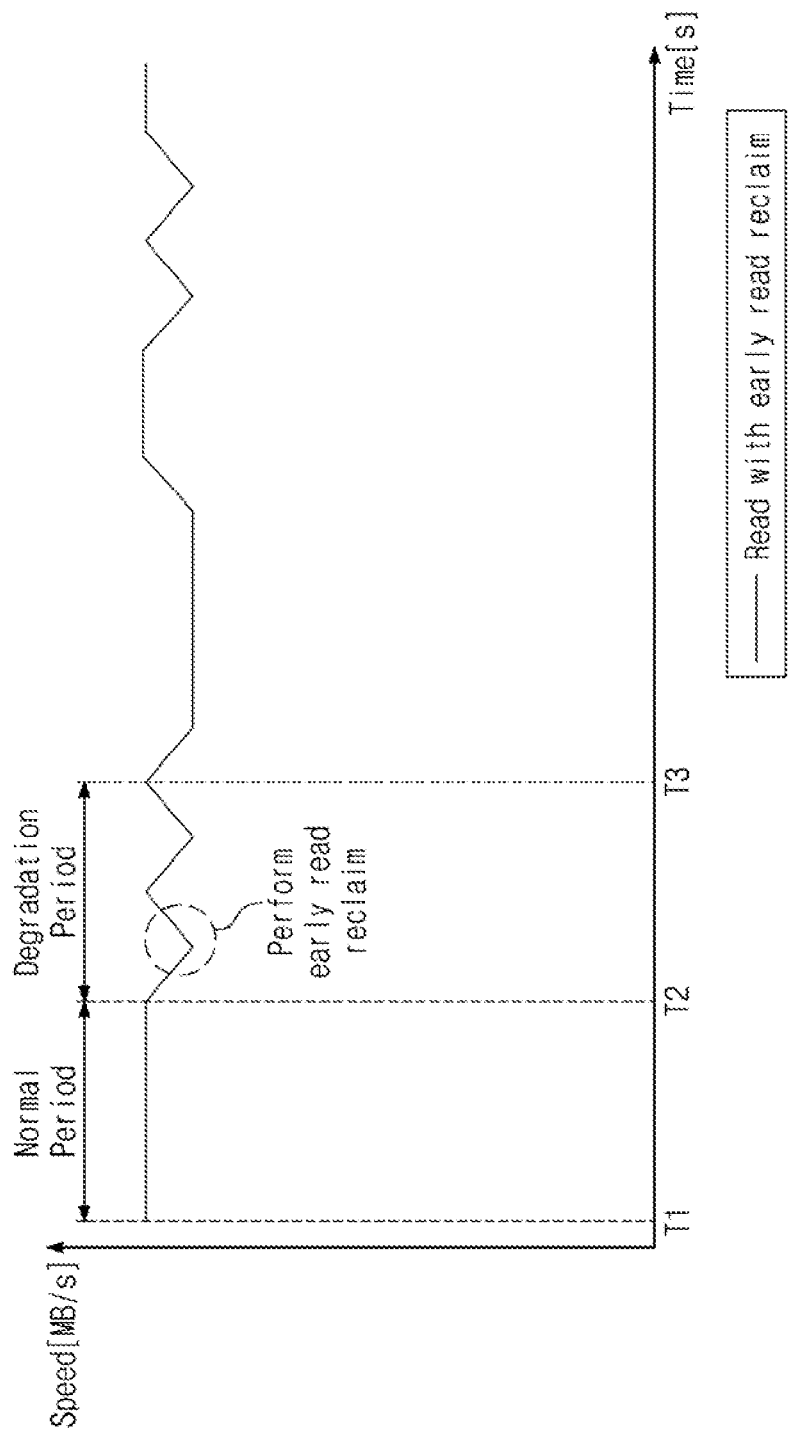
FIG. 12 is a graph describing a performance characteristic of a storage device according to some example embodiments.

FIG. 12 is a graph describing a performance characteristic of a storage device according to some example embodiments.

A performance characteristic of a storage device according to embodiments of the present disclosure will be described with reference to FIG. 12. The performance characteristic may indicate a data I/O speed in a storage device. In FIG. 12, a solid line indicates the performance characteristic of the read operation to which the early read reclaim technique is applied, according to an example embodiment. In FIG. 12, a horizontal axis represents a time, and a vertical axis represents a speed.

According to example embodiments, a storage device may perform the early read reclaim operation based on history data. The early read reclaim operation may be a read reclaim operation that is performed before performance drop-off of a target memory block occurs. According to an example embodiment, the early read reclaim is performed before entering the defense code period. Thus, the early read reclaim may be performed before an uncorrectable error occurs or the sharp reduction of performance occurs, and may be distinguished from the general ex-post read reclaim operation that is performed after an uncorrectable error occurs.

The storage device of the present example embodiment may operate sequentially in a normal period and a degradation period. The normal period is similar to the normal period of FIG. 11, and thus, additional description will be omitted to avoid redundancy.

The period between the second point in time T2 and the third point in time T3 is the degradation period. In the degradation period, a performance characteristic of the read operation may decrease. The storage device of the present example embodiment may determine whether a performance characteristic decreases, based on history data. The storage device may determine whether the early read reclaim operation for the target memory block is called for, based on the variations (e.g., skew information) of count information or error count information in the history data. After the storage device performs the early read reclaim operation, the performance characteristic of the read operation may increase. Afterwards, the performance characteristic of the read operation may repeatedly increase and decrease within a given range without a sharp decrease.

As described above, according to example embodiments, the early read reclaim operation may be performed in the degradation period, before the performance drop-off occurs. Thus, a sharp reduction of performance of the storage device may be avoided and, as such, the reliability of data of the storage device may be improved and a data processing speed may increase.

Figure 13:
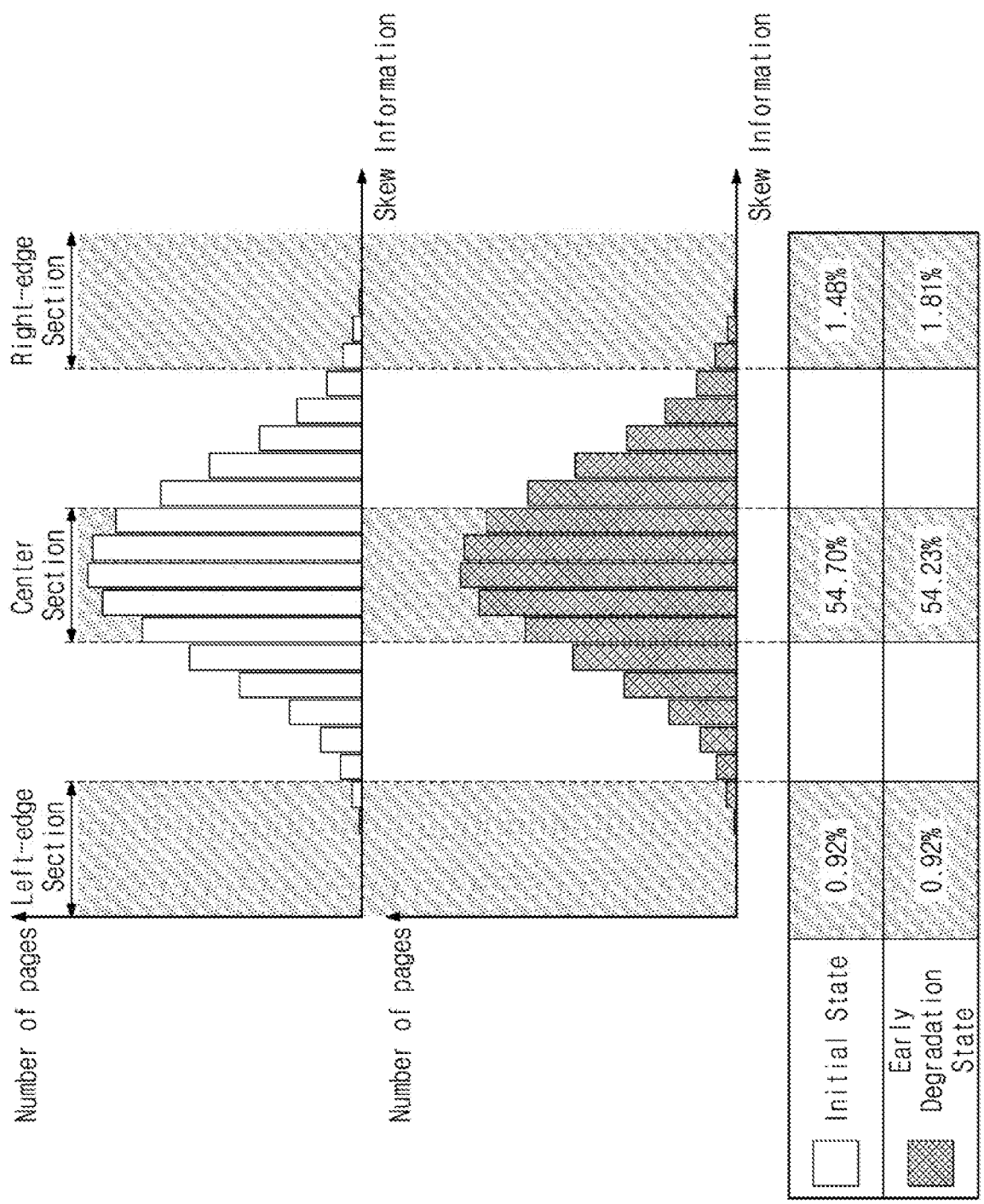
FIG. 13 is a graph describing a read reclaim operation using skew information according to some example embodiments.

FIG. 13 is a graph describing a read reclaim operation using skew information according to some example embodiments.

Skew information of an initial state and an early degradation state will be described with reference to FIG. 13. In FIG. 13, a horizontal axis represents skew information, and a vertical axis represents a number of pages.

The skew information may be a value that is obtained by subtracting a value of count information of raw data read through a current history read operation from a value of count information that is previously registered. In another implementation, the skew information may be a value that is obtained by subtracting a value of error count information of the raw data read through the current history read operation from a value of error count information previously registered. The count information and the error count information may be managed in units of logical page. The skew information may be managed by a history table and a skew information management module.

According to some example embodiments, when a read operation is performed on memory cells of the same word line by using the same read voltage level, an error (e.g., skew information) sensed in the read operation may have a normal distribution.

Below, for convenience of description, a left-edge section, a right-edge section, and a center section are defined.

The left-edge section may be a section in which a value of skew information is smaller than a left-edge reference value. For example, the left-edge reference value may be a negative number. As the number of pages having the skew information corresponding to the left-edge section increases, an increment of a value of count information or a value of error count information may become greater.

The right-edge section may be a section in which a value of skew information is greater than a right-edge reference value. For example, the right-edge reference value may be a positive number. As the number of pages having the skew information corresponding to the right-edge section increases, a decrement of a value of count information or a value of error count information may become greater.

The center section may be a section in which a value of skew information is greater than a first center section reference value and is smaller than a second center section reference value. For example, as the number of pages having the skew information corresponding to the center section increases, the variations in a value of count information or a value of error count information may become smaller.

The initial state may be a state immediately after a threshold voltage level of a memory cell is programmed. Referring to the graph of the initial state, a ratio of the number of pages of the left-edge section to the total number of pages may be 0.92%. A ratio of the number of pages of the center section to the total number of pages may be 54.70%. A ratio of the number of pages of the right-edge section to the total number of pages may be 1.48%.

The early degradation state may be a state in which a threshold voltage distribution decreases as a time passes from the initial state, but the degradation is a little progressed. Referring to the graph of the early degradation state, a ratio of the number of pages of the left-edge section to the total number of pages may be 0.92%. A ratio of the number of pages of the center section to the total number of pages may be 54.23%. A ratio of the number of pages of the right-edge section to the total number of pages may be 1.81%.

In some example embodiments, based on the skew information of the early degradation state, the storage device may determine that there is no need to perform a read reclaim operation on a target memory block. For example, when a value of the left-edge section is smaller than a left-edge threshold ratio, a value of the right-edge section is smaller than a right-edge threshold ratio, and a value of the center section is greater than a center section threshold ratio, the storage device may determine that there is no need to perform the read reclaim operation on the target memory block.

In another case, the storage device may determine that there is a need to perform the read reclaim operation on the target memory block, as will now be described.

Figure 14:
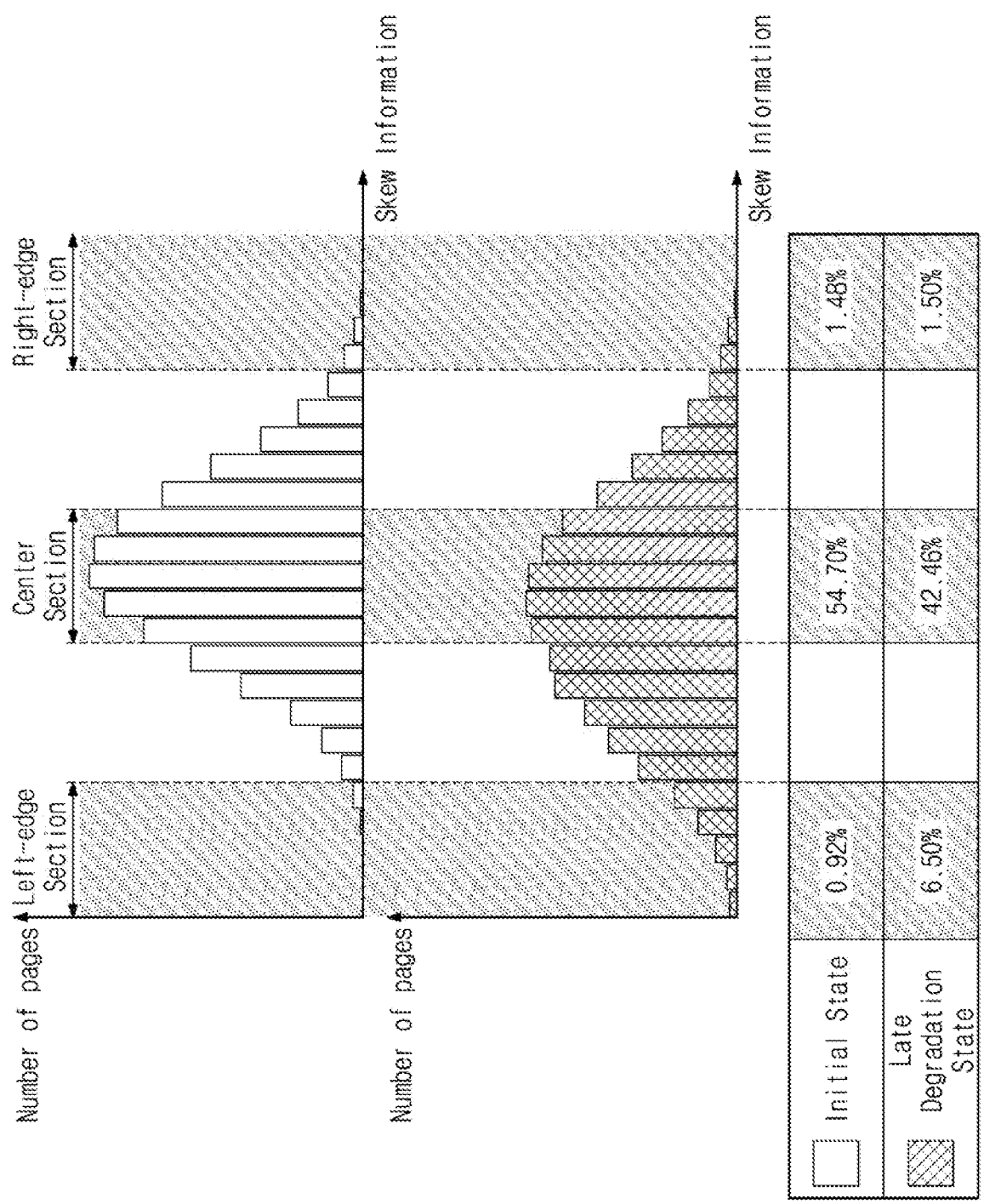
FIG. 14 is a graph describing a read reclaim operation using skew information according to some example embodiments.

FIG. 14 is a graph describing a read reclaim operation using skew information according to some example embodiments.

Skew information of an initial state and a late degradation state will be described with reference to FIG. 14. In FIG. 14, a horizontal axis represents skew information, and a vertical axis represents the number of pages.

Characteristics of skew information of the initial state, the left-edge section, the right-edge section, and the center section are similar to those described with reference to FIG. 13, and thus, additional description will be omitted to avoid redundancy.

The late degradation state may be a state in which a threshold voltage distribution greatly decreases as a lot of time passes from the initial state and the degradation is greatly progressed. Referring to the graph of the late degradation state, a ratio of the number of pages of the left-edge section to the total number of pages may be 6.50%. A ratio of the number of pages of the center section to the total number of pages may be 42.46%. A ratio of the number of pages of the right-edge section to the total number of pages may be 1.50%.

In some example embodiments, based on the skew information of the late degradation state, the storage device may determine that there is a need to perform a read reclaim operation on a target memory block. For example, when a value of the left-edge section is greater than the left-edge threshold ratio, a value of the right-edge section is greater than the right-edge threshold ratio, and a value of the center section is smaller than the center section threshold ratio, the storage device may determine that there is a need to perform the read reclaim operation on the target memory block.

Figure 15:
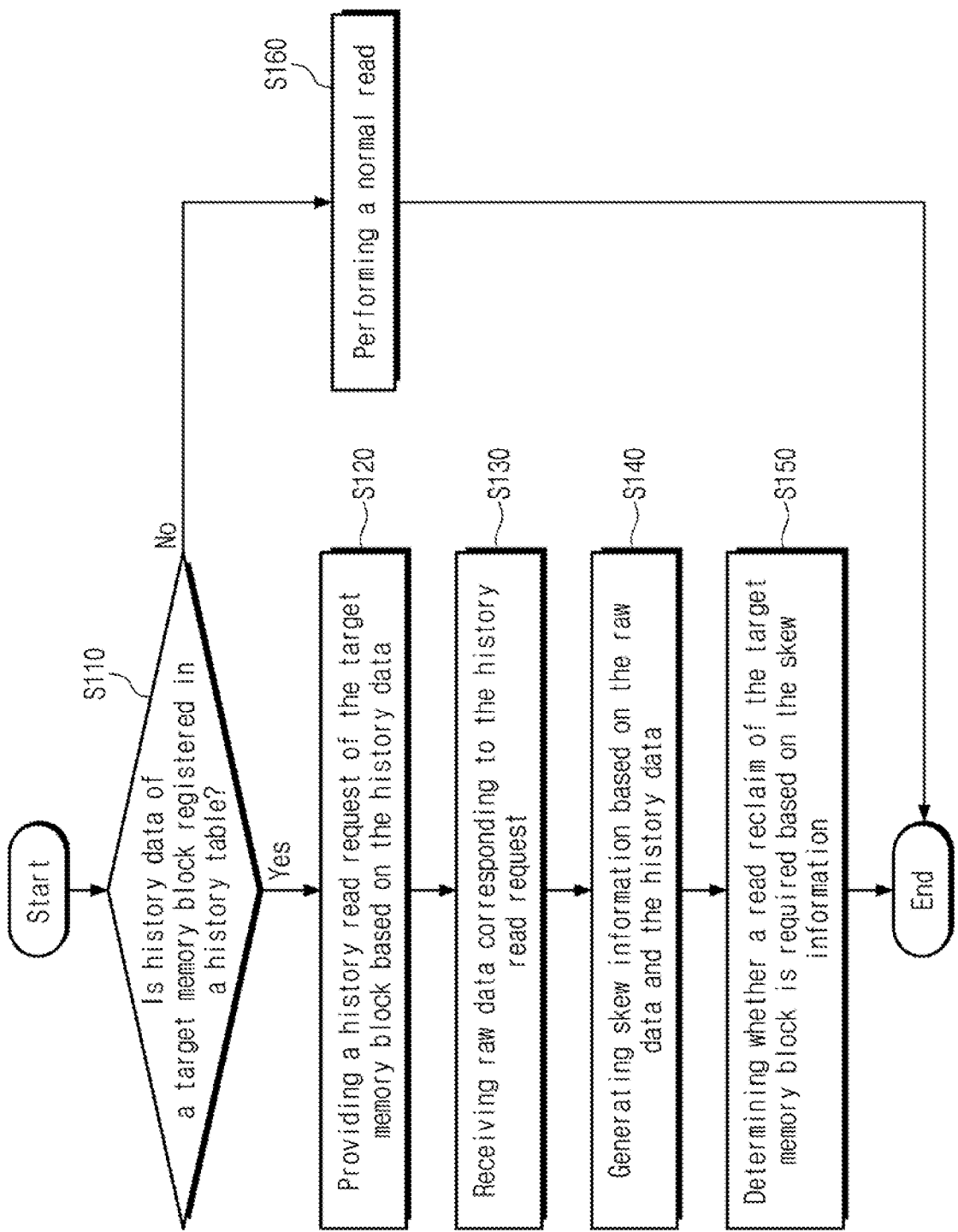
FIG. 15 is a flowchart describing a method of operating a storage controller according to some example embodiments.

FIG. 15 is a flowchart describing a method of operating a storage controller according to some example embodiments.

A method of operating a storage controller according to some example embodiments will be described with reference to FIG. 15. The storage controller may communicate with a non-volatile memory device. The storage controller may include a history table. The storage controller may correspond to the storage controller 110 of FIGS. 1, 2, 6, and 7.

In operation S110, the storage controller may determine whether history data of a target memory block are registered at the history table. When it is determined that the history data are registered, the storage controller may perform operation S120, and when it is determined that the history data are not registered, the storage controller may perform operation S160.

In operation S120, the storage controller may provide the non-volatile memory device with the history read request for the target memory block, based on history data of the history table. The history read request may be used to request a read operation that is based on a voltage level of optimized read voltage information of the history data.

In operation S130, the storage controller may receive raw data corresponding to the history read request from the non-volatile memory device.

In operation S140, the storage controller may generate skew information based on the raw data and the history data.

In some example embodiments, the storage controller may generate first count information and first error count information based on the history data. The storage controller may generate second count information and second error count information based on the raw data. The storage controller may generate skew information based on the first count information and the second count information, or may generate skew information based on the first error count information and the second error count information.

In operation S150, the storage controller may determine whether there is a need to perform the read reclaim operation on the target memory block, based on the skew information. When it is determined that there is no need to perform the read reclaim operation, the storage controller may terminate the history read operation. When it is determined that there is a need to perform the read reclaim operation, the storage controller may perform the read reclaim operation for the target memory block.

In some example embodiments, the storage controller may perform the early read reclaim operation based on the skew information. The early read reclaim operation may be a read reclaim operation that is performed before performance drop-off of the target memory block occurs.

Returning to operation 110, when it is determined that the history data are not registered, the storage controller may perform operation S160.

In operation S160, the storage controller may perform the normal read operation. For example, the storage controller may provide the normal read request to the non-volatile memory device. The normal read request may be used to request a read operation that is based on a default read voltage.

Figure 16:
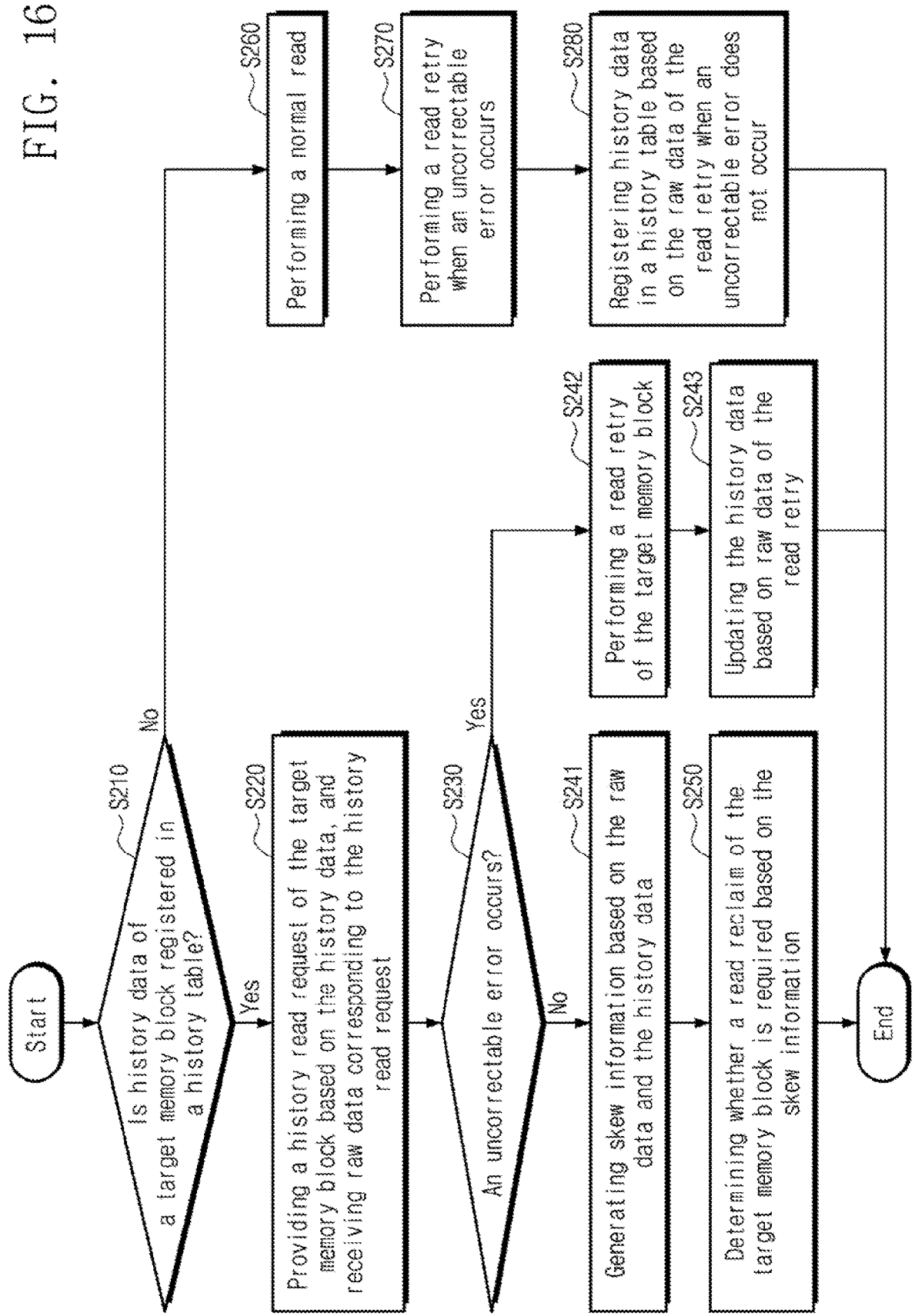
FIG. 16 is a flowchart describing a method of operating a storage controller according to some example embodiments.

FIG. 16 is a flowchart describing a method of operating a storage controller according to some example embodiments.

A method of operating the storage controller according to some example embodiments will be described with reference to FIG. 16. The storage controller may communicate with a non-volatile memory device. The storage controller may include a history table. The storage controller may correspond to the storage controller 110 of FIGS. 1, 2, 6, and 7. Operation S210, operation S241, operation S250, and operation S260 are similar to operation S110, operation S140, operation S150, and operation S160 of FIG. 15, and thus additional description will be omitted to avoid redundancy.

In operation S220, the storage controller may provide the non-volatile memory device with the history read request for a target memory block, based on history data of the history table. The storage controller may receive raw data corresponding to the history read request from the non-volatile memory device.

In operation S230, the storage controller may determine whether an error of the raw data obtained in operation S220 is uncorrectable. When it is determined that the error of the raw data is correctable, operation S241 and operation S250 may be performed. When it is determined that the error of the raw data is uncorrectable, the storage controller may perform operation S242 and operation S243.

In operation S242, the storage controller may perform the read retry operation on the target memory block. For example, the storage controller may again perform the read operation for the target memory block based on a changed read voltage. When new raw data obtained through the read retry operation have an uncorrectable error, the storage controller may again perform the read retry operation or may terminate the read operation. When it is determined that the new raw data obtained through the read retry operation do not have an uncorrectable error, the storage controller may perform operation S243.

In operation S243, the storage controller may update the history data based on the new raw data obtained through the read retry operation. For example, when the new raw data obtained through the read retry operation do not have an uncorrectable error, the storage controller may update history data in the history table. When the new raw data obtained through the read retry operation have an uncorrectable error, the storage controller may further perform the read retry operation instead of updating the history data.

Returning to operation S210, when it is determined that the history data are not registered, the storage controller may perform operation S260. After performing operation S260, the storage controller may perform operation S270.

When raw data obtained by the normal read operation have an uncorrectable error, in operation S270, the storage controller may perform the read retry operation. In contrast, when the raw data obtained by the normal read operation do not have an uncorrectable error, the storage controller may terminate the read operation without registering the history data.

When the raw data obtained through the read retry operation in operation S270 do not have an uncorrectable error, in operation S280, the storage controller may store the history data in the history table based on the raw data obtained through the read retry operation in operation S270. The stored history data may be used in a next history read operation for the target memory block.

By way of summation and review, memory cells of a non-volatile memory device may have a programmed threshold voltage distribution corresponding to a bit value of data. A threshold voltage distribution may change due to various factors such as retention, read disturb, hot-carrier injection (HCI), and the like. The change in the threshold voltage distribution may cause a reduction of reliability of the non-volatile memory device. To avoid this, a read reclaim technique, for copying data stored in a memory region of the non-volatile memory device to another memory region, may be used. However, a read reclaim operation that is performed after a large deterioration of performance of the non-volatile memory device may not avoid a large reduction of performance of the non-volatile memory device.

As described above, embodiments may provide a storage controller using history data, a method of operating the same, and a method of operating a storage device including the same are provided. According to an example embodiment, a read reclaim operation is performed based on obtained history data without an additional read operation. Thus, an example embodiment may provide a storage controller that avoids a sharp decrease in an input/output speed, improves the reliability of data stored therein, and improves a speed at which data are processed. Example embodiments also provide a method of operating the same, a storage device including the same, and a method of operating a storage device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of operating a storage controller which includes a history table and communicates with a non-volatile memory device, the method comprising:
    determining whether history data of a target memory block are registered at the history table;
    when it is determined that the history data are registered, providing a history read request for the target memory block based on the history data;
    receiving first raw data corresponding to the history read request from the non-volatile memory device, wherein the first raw data comprises uncorrected data;
    generating skew information of the target memory block based on the first raw data and the history data; and
    determining whether to perform a read reclaim operation of the target memory block, based on the skew information, wherein the read reclaim operation comprises copying data stored in the target memory block to another memory block.

2. The method as claimed in claim 1, wherein the read reclaim operation corresponds to an early read reclaim operation performed before performance drop-off of the target memory block occurs.

3. The method as claimed in claim 1, wherein the history data include at least one of:
    count information of the target memory block,
    error count information of the target memory block, or
    optimized read voltage information of the target memory block.

4. The method as claimed in claim 3, wherein:
    the target memory block includes a plurality of memory cells, each of the plurality of memory cells having a threshold voltage level corresponding to a first value or a second value for each page type, and
    the count information indicates a number of memory cells having the first value from among the plurality of memory cells for each page type.

5. The method as claimed in claim 3, wherein:
    the target memory block includes a plurality of memory cells, each of the plurality of memory cells having a threshold voltage level corresponding to a first value or a second value for each page type, and
    the error count information indicates a number of memory cells, each of which is determined as the second value is stored therein even though programmed to have the first value or is determined as the first value is stored therein even though programmed to have the second value.

6. The method as claimed in claim 3, wherein:
    the target memory block includes a plurality of memory cells, each of the plurality of memory cells having a threshold voltage level corresponding to one of an erase state and at least one programming state,
    the erase state and the at least one programming state are distinguished by at least one read voltage level, and
    the optimized read voltage information indicates at least one optimized read voltage level corresponding to the at least one read voltage level.

7. The method as claimed in claim 3, wherein, as a time difference becomes greater between a first point in time when the history data are registered at the history table and a second point in time when the history read request for the target memory block is provided, a value of the count information decreases, a value of the error count information increases, and a value of the optimized read voltage information decreases.

8. The method as claimed in claim 3, wherein, as a time difference becomes greater between a first point in time when the history data are registered at the history table and a second point in time when the history read request for the target memory block is provided, a value of the count information increases, a value of the error count information increases, and a value of the optimized read voltage information decreases.

9. The method as claimed in claim 1, wherein:
    the history data include first count information of the target memory block based on a previous read operation, and
    the generating of the skew information of the target memory block based on the first raw data and the history data includes:
    generating second count information of the target memory block based on the first raw data; and
    generating the skew information by subtracting a value of the second count information from a value of the first count information.

10. The method as claimed in claim 1, wherein:
    the history data include first error count information of the target memory block based on a previous read operation, and
    the generating of the skew information of the target memory block based on the first raw data and the history data includes:
    generating second error count information of the target memory block based on the first raw data; and
    generating the skew information by subtracting a value of the second error count information from a value of the first error count information.

11. The method as claimed in claim 1, wherein:
    the skew information includes first values corresponding to a first edge section, second values corresponding to a second edge section, and third values corresponding to a center section, and the determining whether to perform the read reclaim operation of the target memory block based on the skew information includes requesting the read reclaim operation of the target memory block, when:
- a ratio of the first values to all the first to third values of the skew information is greater than a first threshold ratio,
- a ratio of the second values to all the first to third values of the skew information is greater than a second threshold ratio, or
- a ratio of the third values to all the first to third values of the skew information is smaller than a third threshold ratio.

12. The method as claimed in claim 1, wherein the generating of the skew information of the target memory block based on the first raw data and the history data includes:
- determining whether an error of the first raw data is uncorrectable; and
- when it is determined that the error of the first raw data is correctable, generating the skew information of the target memory block based on the first raw data and the history data.

13. The method as claimed in claim 1, wherein the generating of the skew information of the target memory block based on the first raw data and the history data includes:
- determining whether an error of the first raw data is uncorrectable;
- when it is determined that the error of the first raw data is uncorrectable, performing a read retry operation for the target memory block; and
- when it is determined that the error of the first raw data is correctable, updating the history data of the target memory block in the history table based on the first raw data.

14. The method as claimed in claim 1, further comprising:
- when it is determined that the history data are registered, performing a normal read operation.

15. The method as claimed in claim 14, wherein the performing of the normal read operation when it is determined that the history data are registered includes:
- providing a normal read request for the target memory block based on a default rad voltage;
- receiving second raw data corresponding to the normal read request from the non-volatile memory device;
- determining whether an error of the second raw data is uncorrectable;
- when it is determined that the error of the second raw data is uncorrectable, providing a read retry request for the target memory block based on a changed read voltage;
- receiving third raw data corresponding to the read retry request from the non-volatile memory device;
- determining whether an error of the third raw data is uncorrectable; and
- when it is determined that the error of the third raw data is correctable, registering the history data of the target memory block in the history table based on the third raw data.

16. A method of operating a storage device which includes a non-volatile memory device and a storage controller, the method comprising:
- determining, by the storage controller, whether history data of a target memory block are registered at a history table of the storage controller;
- when it is determined that the history data are registered, providing, by the storage controller, a history read request for the target memory block based on the history data; providing, by the non-volatile memory device, raw data corresponding to the history read request, wherein the raw data comprises uncorrected data;
- generating, by the storage controller, skew information of the target memory block based on the raw data and the history data; and
- determining, by the storage controller, whether to perform a read reclaim operation of the target memory block, based on the skew information, wherein the read reclaim operation comprises copying data stored in the target memory block to another memory block.

17. The method as claimed in claim 16, wherein:
the history data include at least one of:
count information of the target memory block,
error count information of the target memory block, or
optimized read voltage information of the target memory block, and
the skew information includes a first value obtained by subtracting a value of count information of the raw data from a value of the count information of the history data, or a second value obtained by subtracting a value of error count information of the raw data from a value of the error count information of the history data.

18. A storage controller, comprising:
- a history table configured to manage history data of a target memory block of a non-volatile memory device;
- a read management module configured to manage a history read operation with reference to the history table;
- a command generator configured to provide the non-volatile memory device with a first command indicating a history read request for the target memory block under control of the read management module;
- a skew information management module configured to receive first raw data corresponding to the first command from the non-volatile memory device, to receive the history data from the history table, and to generate skew information of the target memory block based on the first raw data and the history data, wherein the first raw data comprises uncorrected data; and
- a read reclaim module configured to manage a read reclaim operation of the target memory block based on the skew information, wherein the read reclaim operation comprises copying data stored in the target memory block to another memory block.

19. The storage controller as claimed in claim 18, further comprising:
- a counter configured to receive the first raw data corresponding to the first command from the non-volatile memory device, and to generate first count information based on the first raw data; and
- an error correction code engine configured to receive the first raw data corresponding to the first command from the non-volatile memory device, to perform error correction based on the first raw data, and to generate first error count information based on the error correction, wherein:
the history data include second count information and second error count information, and
the skew information management module is further configured to generate the skew information by subtracting a value of the first count information from a value of the second count information, or subtracting a value of the first error count information from a value of the second error count information.

20. The storage controller as claimed in claim 18, further comprising:
- an error correction code (ECC) engine configured to receive the first raw data corresponding to the first command from the non-volatile memory device and to perform error correction based on the first raw data; and
- a read retry module configured to determine whether there to perform a read retry operation on the target memory block, based on communication with the ECC Engine, wherein:
- the command generator is further configured to provide the non-volatile memory device with a second command indicating a read retry request for the target memory block under control of the read retry module,
- the ECC engine is further configured to receive second raw data corresponding to the second command from the non-volatile memory device, and to perform error correction based on the second raw data, and
- the read retry module is further configured to update the history data of the history table based on the second raw data, when it is determined that the second raw data do not have an uncorrectable error based on the communication with the ECC engine.

* * * * *